(12) United States Patent
Gritsenko et al.

(10) Patent No.: US 10,965,399 B2
(45) Date of Patent: Mar. 30, 2021

(54) METHODS AND APPARATUS FOR TRANSMISSION AND RECEPTION WITH POLAR CODES

(71) Applicant: HUAWEI TECHNOLOGIES CO., LTD., Shenzhen (CN)

(72) Inventors: Vladimir Gritsenko, Moscow (RU); Aleksei Eduardovich Maevskii, Moscow (RU); Hejia Luo, Hangzhou (CN); Rong Li, Hangzhou (CN); Jun Wang, Hangzhou (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 1 day.

(21) Appl. No.: 16/423,178

(22) Filed: May 28, 2019

(65) Prior Publication Data
US 2019/0296857 A1 Sep. 26, 2019

Related U.S. Application Data

(63) Continuation of application No. PCT/CN2017/084212, filed on May 12, 2017.

(51) Int. Cl.
*H03M 13/00* (2006.01)
*H04L 1/00* (2006.01)
(Continued)

(52) U.S. Cl.
CPC .......... *H04L 1/0042* (2013.01); *H03M 13/13* (2013.01); *H03M 13/3769* (2013.01);
(Continued)

(58) Field of Classification Search
CPC ... H04L 1/0042; H04L 1/0057; H04L 1/0061; H03M 13/6368; H03M 13/3769; H03M 13/13; H03M 13/09; H03M 13/2906
See application file for complete search history.

(56) References Cited

U.S. PATENT DOCUMENTS 8,347,186 B1 1/2013 Arikan
8,578,252 B2 11/2013 Okamura et al.
(Continued)

FOREIGN PATENT DOCUMENTS

CN 103222217 A 7/2013
CN 105656604 A 6/2016
(Continued)

OTHER PUBLICATIONS

Magali Bardet et al.,"Algebraic Properties of Polar Codes From a New Polynomial Formalism",2016 IEEE International Symposium on Information Theory,total 5 pages.
(Continued)

*Primary Examiner* — Samir W Rizk
(74) *Attorney, Agent, or Firm* — Kilpatrick Townsend & Stockton LLP

(57) ABSTRACT

Method and apparatus for transmission and reception with polar codes are provided to support up to 16 permutations or transformation mappings. For example, 16 versions of copies able to be soft-combined for PBCH or any other data channel or control channel are suggested if the mother code length is 256 or 512 or 1024. With the new design, up to 16 different versions can be used to soft combined to improve the performance. Some sequences are provided as examples to support 16 different permutation patterns. The inverse of these sequences also have the feature to support 16 different permutation patterns.

20 Claims, 10 Drawing Sheets

(51) Int. Cl.
*H03M 13/37* (2006.01)
*H03M 13/13* (2006.01)
*H03M 13/09* (2006.01)
*H03M 13/29* (2006.01)

(52) U.S. Cl.
CPC ...... *H03M 13/6368* (2013.01); *H04L 1/0057* (2013.01); *H04L 1/0061* (2013.01); *H03M 13/09* (2013.01); *H03M 13/2906* (2013.01)

(56) References Cited

U.S. PATENT DOCUMENTS

| | | |
|---|---|---|
| 2013/0117344 A1 | 5/2013 | Gross et al. |
| 2014/0019820 A1* | 1/2014 | Vardy .................. H03M 13/13 714/752 |
| 2015/0091742 A1 | 4/2015 | Ionita et al. |
| 2015/0249522 A1 | 9/2015 | Deng et al. |
| 2016/0013810 A1 | 1/2016 | Gross et al. |
| 2016/0182187 A1 | 6/2016 | Kim et al. |
| 2016/0248547 A1 | 8/2016 | Shen et al. |

FOREIGN PATENT DOCUMENTS

| | | |
|---|---|---|
| CN | 105164959 B | 6/2019 |
| CN | 105453466 B | 1/2020 |

OTHER PUBLICATIONS

Erdal Arikan ,"Channel Polarization: A Method for Constructing Capacity-Achieving Codes for Symmetric Binary-Input Memoryless Channels",IEEE Transactions on Information Theory, vol. 55, No. 7, Jul. 2009,total 23 pages.

Huawei, HiSilicon,"Soft-combining for PBCH",3GPP TSG RAN WG1 Meeting #89 R1-1708158,Hangzhou, China, May 15-19, 2017,total 9 pages. XP051263160.

Christian Schürch et al. A partial order for the synthesized channels of a polar code, 2016 IEEE Symposium International on Information Theory (ISIT) , Jul. 2016. pp. 220-224. XP032940235.

Kai Niu et al. Polar codes: Primary concepts and practical decoding algorithms, IEEE Communications Magazine ( vol. 52 , Issue: 7 , Jul. 2014 ), pp. 192-203, XP011553413.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

100

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Length $N = 2^m$, $m \in \mathbb{N}$
Generator matrix: Columns of $G_2^{\otimes m}$

212

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Frozen-bit $u_0$ — $x_0$ encoded-bit
Frozen-bit $u_1$ — $x_1$ encoded-bit
Frozen-bit $u_2$ — $x_2$ encoded-bit
Info-bit $u_3$ — $x_3$ encoded-bit
Frozen-bit $u_4$ — $x_4$ encoded-bit
Info-bit $u_5$ — $x_5$ encoded-bit
Info-bit $u_6$ — $x_6$ encoded-bit
Info-bit $u_7$ — $x_7$ encoded-bit

104

200 → $x = [0 \ 0 \ 0 \ u_3 \ 0 \ u_5 \ u_6 \ u_7] G_2^{\otimes 3}$

FIG. 2

METHODS AND APPARATUS FOR TRANSMISSION AND RECEPTION WITH POLAR CODES

CROSS-REFERENCE TO RELATED APPLICATIONS

This application is a continuation of International Application No. PCT/CN2017/084212, filed on May 12, 2017, the disclosure of which is hereby incorporated by reference in its entirety.

FIELD

The present disclosure relates to generally to communications using polar encoding and decoding.

BACKGROUND

Polar codes are proposed as channel codes for use in future wireless communications, and have been selected for uplink and downlink eMBB control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding is one option for decoding polar coded information.

Based on channel polarization, Arikan designed a channel code that is proven to reach channel capacity. Polarization refers to a coding property that, as code length increases to infinity, bit-channels polarize and their capacities approach either zero (completely noisy channel) or one (completely perfect channel). The fraction of perfect bit-channels is equal to the capacity of a channel.

In Long Term Evolution (LTE) communication system, physical broadcast channel (PBCH) carries main information block (MIB). The MIB information encoded by cascading cyclic redundancy check (CRC) and tailing bit convolution coding (TBCC) and then duplicated to obtain four PBCH segments of equal size. These four PBCH segments are scrambled by four scrambling sequences respectively. Each segment may be decoded independently or jointly decoded with other segments. It should be noted that the Polar code referred to in the present application includes but is not limited to: CRC cascade Polar code, Parity Check cascade Polar code, Arikan traditional Polar code and CRC aided Polar code.

In 5G, with a new frame structure, more than four copies of PBCH may be needed to be soft combined to improve the detection performance in case any joint decoding. Hence, some modification should be made on polar coding to make it feasible to transmit PBCH with more than four copies and also maybe feasible to other control or data channels.

SUMMARY

Illustrative embodiments are disclosed by way of example in the description and claims.

In long term evolution (LTE) system, only four versions of copies for primary broadcast channel (PBCH) information can be provided. In 5G, more versions need to be supported to have better performance. In this application, the method and apparatus for transmission and reception with polar codes to support up to 16 permutations or transformation mappings, i.e., 16 versions of copies able to be soft-combined for PBCH or any other data channel or control channel are suggested if the mother code length is 256 or 512 or 1024. With the new design, up to 16 different versions can be used to soft combined to improve the performance. Some sequences are provided as examples to support 16 different permutation patterns. The inverse of these sequences also have the feature to support 16 different permutation patterns.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 2 is a diagram showing an example use of a polar coding generator matrix for producing codewords and a schematic illustration of an example polar encoder.

DETAILED DESCRIPTION

Figure 3:
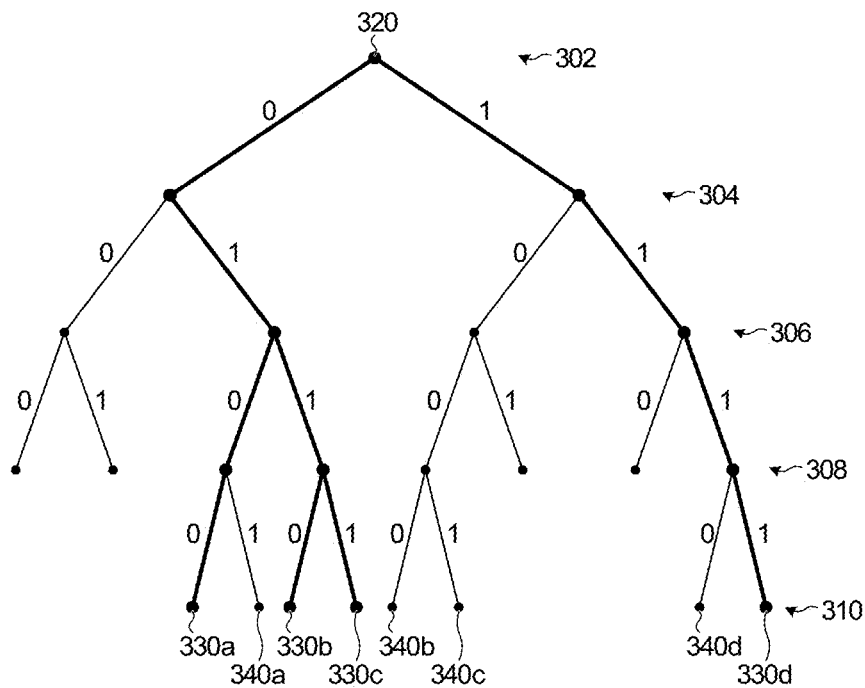
FIG. 3 is a diagram showing a portion of an example decision list tree whose width is limited by a maximum given list size and used in an SCL (Successive Cancellation List) polar decoder.

Below are notations and definitions described herein.
Notation List:

$$G_2 - \text{matrix} \begin{bmatrix} 1 & 0 \\ 1 & 1 \end{bmatrix};$$

$G_2^{\otimes m}$—m-th Kronecker power of $G_2$;
$g_i$—i-th row of $G_2^{\otimes m}$;
$m_i$—m-variate monomial corresponds to $g_i$;
$N=2^m$—length of Polar code;
k—number of information bits;
$\{0, 1, \ldots, N-1\}$—set of integers from 0 to N-1;
I—set of informational bits of the Polar code (subset of $\{0, 1, \ldots, N-1\}$);
LLR: likelihood ratio;
F—set of frozen bits of the Polar code (subset of $\{0, 1, \ldots, N-1\}$);
$M_C$—generator monomial set of the Polar code C;
M—submatrix of $G_2^{\otimes m}$ that include all rows with row weight of N/2;
$R_m$—set of m-variate polynomials;
π—permutation in code domain;
id—identical permutation in code domain;
$M_\pi$—matrix constructed from M by use permutation π;
φ—transformation map on $R_m$;
$BS^{(m)}$—basic ordered sequence;
$[i]=([i]^{(0)}, [i]^{(1)}, \ldots, [i]^{(m-1)})$—binary expansion of number i;
⌈a⌉—least integer bigger or equal than a.
d—degree of permutation pattern π, defined as $d=\min\{s|\pi^s=id,\ s\text{ is a natural number}\}$, i.e., the number of maximum version can be supported.
dr—number of permutation patterns implemented, dr<=d.

Definitions

1. Defined monomial for all $i \in \{0, 1, \ldots, N-1\}$ as follows:

$$m_i = \prod_{j \in J_i} x_j,$$

where $J_i \subseteq \{0, 1, \ldots, m-1\}$ such that $$N-i-1 = \sum_{j \in J_i} 2^j.$$

Each vector $v \in \{0,1\}^N$ corresponds m-variate $f(x_0, x_1, \ldots, x_{m-1})$ polynomial by follows $$f(x_0, x_1, \ldots, x_{m-1}) = \sum_{i=0}^{N-1} a_i \cdot m_i,$$

Where $x_j$ is a variable and coefficients $a_0, a_1, \ldots, a_{N-1}$ can be uniquely obtained from the equation $$v = \sum_{i=0}^{N-1} a_i \cdot g_i.$$

Thus, for each row $g_i$ in $G_2^{\otimes m}$, there is only one $m_i$ corresponding to this $g_i$.

2. Generator monomial set $M_C$ of polar code C is defined by follows $$M_C = \bigcup_{i \in I} m_i.$$

3. M is m×N matrix whose rows are $g_{N-1-2^0}, g_{N-1-2^1}, \ldots, g_{N-1-2^{m-1}}$. Rows of M correspond monomials $x_0, x_1, \ldots, x_{m-1}$ respectively.

4. $R_m$ is a set of polynomial obtained by all linear combination of monomials from the set $\{m_0, m_1, \ldots, m_N\}$. Multiplication operation * of $R_m$ elements is defined by following formula:
$\forall f,h \in R_m\ f*h = \mathrm{mod}(f \cdot h(x_0^2-x_0, x_1^2-x_1, \ldots, x_{m-1}^2-x_{m-1}))$ 5. $M_\pi$ constructed from M, where i-th column of M is π(i) column of $M_\pi$. The subscript π means that the rule for constructing $M_\pi$ is based on the permutation pattern π. For any φ be a bijective map from $R_m$ to $R_m$ denote a matrix $M_\varphi$ as matrix whose rows correspond to polynomials $\varphi(x_0), \varphi(x_1), \ldots, \varphi(x_{m-1})$. The subscript φ means that the rule for constructing $M_\varphi$ is based on transformation map φ. The map φ is called transformation if all conditions bellow are satisfied:
 a. The map φ is linear;
 b. The matrix $M_\varphi$ has as a columns all binary vectors of length m;
 c. For any subset J of $\{0, 1, \ldots, m-1\}$ holds equality $$\varphi\left(\prod_{j \in J} x_j\right) = \prod_{j \in J} \varphi(x_j);$$

For any transformation map φ we always have $\varphi(1)=1$.

6. Let $BS^{(m)}=(i_0, \ldots, i_{2^m-1})$ be a basic ordered sequence of length $2^m$, i.e., in order to construct $(2^m,k)$ polar code, set $F=\{i_0, \ldots, i_{2^m-k-1}\}$ is taken as a set of frozen symbols and $I=\{i_{2^m-k}, \ldots, i_{2^m-1}\}$ as a set of information symbols.

7. A basic ordered sequence $BS^{(m)}=(i_0, \ldots, i_{2^m-1})$ has a symmetric property if the sequence satisfied follows:
 a. The sequence $BS^{(m)}$ satisfy Universal Partial Order (UPO)
 b. For all s, t from $\{0, 1, \ldots, 2^m-1\}$ and for all j from $\{0, 1, \ldots, m-1\}$ such that given s<t and $[i_s]^{(j)}=[i_t]^{(j)}=1$, we have ŝ<t̂, where $i_{\hat{s}}=i_s-2^j$, $i_{\hat{t}}=i_t-2^j$ 8. Here is an example of monomial definition of an N=8 polar code:

|   | 7 | 6 | 5 | 4 | 3 | 2 | 1 | 0 |   |   |
|---|---|---|---|---|---|---|---|---|---|---|
| $u_0$ | 1 | 0 | 0 | 0 | 0 | 0 | 0 | 0 | $x_2 x_1 x_0$ | $7 = 111_2$ |
| $u_1$ | 1 | 1 | 0 | 0 | 0 | 0 | 0 | 0 | $x_2 x_1$ | $6 = 110_2$ |
| $u_2$ | 1 | 0 | 1 | 0 | 0 | 0 | 0 | 0 | $x_2 x_0$ | $5 = 101_2$ |
| $u_3$ | 1 | 1 | 1 | 1 | 0 | 0 | 0 | 0 | $x_2$ | $4 = 100_2$ |
| $u_4$ | 1 | 0 | 0 | 0 | 1 | 0 | 0 | 0 | $x_1 x_0$ | $3 = 011_2$ |
| $u_5$ | 1 | 1 | 0 | 0 | 1 | 1 | 0 | 0 | $x_1$ | $2 = 010_2$ |
| $u_6$ | 1 | 0 | 1 | 0 | 1 | 0 | 1 | 0 | $x_0$ | $1 = 001_2$ |
| $u_7$ | 1 | 1 | 1 | 1 | 1 | 1 | 1 | 1 | 1 | $0 = 000_2$ |

The rightmost column is the reverse of the binary representation of row index, say $j=(j_2 j_1 j_0)_2$, where least significant bit $j_0$ substitutes to $x_0$, bit $j_1$ substitutes to $x_1$, bit $j_2$ substitutes to $x_2$. For example, the first row can be represented as a 3-variate monomial $x_2x_1x_0$, since the reverse of the binary representation is "$111_2$". With definition 1, the first row is also noted as $m_0=x_0x_1x_2$.

FIG. 1-3 provides a general polar encoding/decoding procedure.

FIG. 1 is a diagram showing, by way of an illustrative example, how a polar coding generator matrix can be produced from a kernel $G_2$ 100. Note that FIG. 1 is an example. Other forms of kernel are also possible. Polarization comes from the "nested" way in which a generator matrix is created from a kernel (or combination of kernels).

The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

A polar code can be formed from a Kronecker product matrix based on matrix $G_2$ 100. For a polar code having codewords of length $N=2^m$, the generator matrix is $G_2^{\otimes m}$. FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is produced by the product of an input vector u=[0 0 0 $u_3$ 0 $u_5$ $u_6$ $u_7$] and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from k=4 information bits and N-k=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As it known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$. (e.g. for n=1 (indicated as 100 in FIG. 1), $G_2=F$). For bit reversal, $G_N=B_NF^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from k information bits including one or more CRC bits, and (N−k) frozen bits. In this example, starting with a number of input bits, a CRC is calculated and appended to the input bits to produce a set of information bits including the input bits and the CRC bits. The remaining (N−k) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

Another type of polar decoding algorithm with greater space efficiency, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. During generation of the decision tree, at each level of the decision tree where the number of paths grows beyond a set threshold L, the L paths having the highest likelihoods are identified, and the remaining paths are discarded. If the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For bit-level decoding, a decoding path generates 2 leaf branches (bit=0|1) for a next decoding bit. An SC decoder tracks only one decoding path. After the value of a decoded bit is estimated, the other possible value is ignored. Decoding continues with the next bit, assuming that each previous bit has been correctly estimated when updating partial sum results.

FIG. 3 is a diagram showing a portion of an example decision list tree whose width is limited by a maximum given list size and used in an SCL polar decoder. In FIG. 3 the list size L is 4. Five levels 302, 304, 306, 308, 310 of the decision tree are illustrated. Although five levels are illustrated, it should be understood that a decision tree to decode N bits would have N+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 3. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into CRC-aided list decoding and pure list decoding, in which survivor paths with the highest likelihood are selected. SC decoding is a special case of pure list decoding, with list size L=1. A CRC may provide better error correction performance in the final path selection, but is optional in SCL decoding. Other decoding-assistant operations such as a parity check based on parity or "PC" bits that are included in an input vector, could be used instead of CRC in final path selection during decoding.

In an Additive White Gaussian Noise (AWGN) channel, a polar code in effect divides a channel into N sub-channels. N is referred to as mother code length and is always is power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
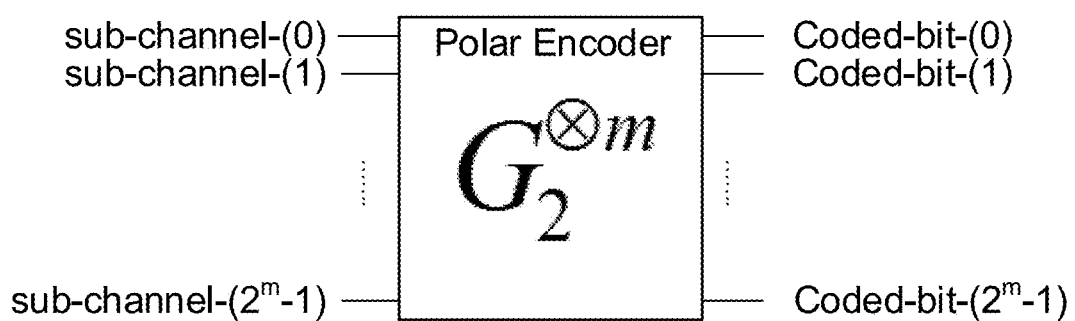
FIG. 4 is a block diagram illustrating an example of a polar encoder based on a 2-by-2 kernel.

Polar encoders based on Kronecker products of a 2-by-2 Arikan kernel $G_2$ are described above. FIG. 4 is a block diagram illustrating an example of a polar encoder based on a 2-by-2 kernel. Sub-channels and coded bits are labeled in FIG. 4, and a channel is divided into N sub-channels by a polar code as noted above. An information block and frozen bits are allocated onto the N sub-channels, and the resultant N-sized vector is multiplied with an N-by-N Kronecker matrix by the polar encoder to generate a codeword that includes N coded bits. An information block includes at least information bits and could also include assistant bits such as CRC bits or PC bits. A sub-channel selector could be coupled to the polar encoder to select at least sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

In C. Schürch, "A partial order for the synthesized channels of a polar code," in Proc. of the IEEE Int. Symposium on Inform. Theory (ISIT), Barcelona, Spain, July 2016, pp. 220-224 and M. Bardet, V. Dragoi, A. Otmani, and J.-P. Tillich, "Algebraic properties of polar codes from a new polynomial formalism," in Proc. of the IEEE Int. Symposium on Inform. Theory (ISIT), Barcelona, Spain, July 2016, pp. 230-234, it has been found that, among ordered sequences generated by different methods, there exists a universal partial order that holds for any transmission model and is therefore transmission model independent. In other words, the ordering of a portion of sub-channels is the same in different ordered sequences and only some sub-channels are ordered differently.

A transmission model includes one or more parameters specific to or indicative of a particular transmission scheme, channel or channel condition including for example, a channel model, type, a transmission/channel quality, for example as expressed in a Channel Quality Index (CQI) report, a noise level, an SNR, etc. Based on the partial order, only approximately $1/\log^{3/2}(N)$ sub-channels, rather than all N sub-channels, need to be considered for reliability ordering. The partial order provides a "tendency" or "mainstream" view about reliability distribution for a given N. U.S. Patent Application No. 62/463,289 entitled "Apparatus and Methods for Coding Sub-Channel Selection" filed on Feb. 24, 2017 and incorporated herein by reference in its entirety provides an example of sub-channel ordering based on partial order.

Figure 5:
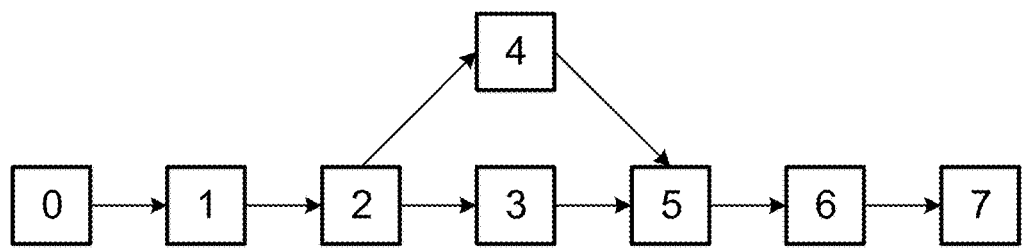
FIG. 5 is a block diagram illustrating an example partial order of N=8 sub-channels.

FIG. 5 is a block diagram illustrating an example partial order of N=8 sub-channels. Each node in the partial order in FIG. 5 represents a sub-channel, and each directed edge or arrow between nodes represents relative reliabilities of the sub-channels. References are made herein to partial orders of sub-channels, and to sub-channel ordering and selection. In a representation of a partial order, nodes represent sub-channels, and sub-channel ordering and selection may involve ordering and selection of nodes. Node ordering and selection represents one example of how sub-channels may be ordered and selected, and therefore nodes and sub-channels may be referenced interchangeably. It should also be noted that sub-channels correspond to bit positions, and bit positions could include at least information bit positions and frozen bit positions. Features disclosed herein with reference to sub-channels may also or instead apply to bit positions. For example, sub-channel ordering and selection as disclosed herein are equivalent to ordering and selecting bit positions. References to nodes, sub-channels, and bits or bit positions should be interpreted accordingly.

For each edge in a partial order representation, the reliability of its source node is always lower than its destination node for any transmission channel. An edge exists between nodes in the example partial order of FIG. 5 if the source node binary index can be transformed into the destination node binary index with a one of the following operations:

Operation 1: if the last (least significant) bit of a source node index is 0, changing the 0-bit from 0 to 1, as in the example of nodes 2 and 3, (0,0,1,0)→(0,0,1,1), is indicative of higher reliability for the destination node index (relative to the source node index);

Operation 2: left-swapping a 1 bit in the source node index with a bit position of an adjacent 0 bit, as in the example of nodes 2 and 4, (0,0,1,0)→(0,1,0,0), is indicative of higher reliability for the destination node index (relative to the source node index).

It should be noted that two nodes without an arrow between them can still have a fixed reliability relationship, as long as there exists at least one directed path composed of arrows between the two nodes, e.g., nodes 1 and 4, nodes 2 and 5.

Other operations may apply in other partial orders.

The edges indicate increasing reliability in the example shown. Partial orders with edges indicating decreasing reliabilities are also possible.

A partial order is "partial" in the sense that not every node, or every sub-channel which is represented by a node, has a reliability relative to all other nodes that is transmission model independent or otherwise fixed. With reference to FIG. 5, sub-channels 0, 1, 2 and 5, 6, 7 have a transmission model independent or fixed order or sequence relative to each other and all other sub-channels. From the example partial order in FIG. 5, it can be seen that sub-channels 3 and 4 both have reliabilities that are higher than the reliability of sub-channel 2 and lower than the reliability of sub-channel 5, but the reliabilities of sub-channels 3 and 4 relative to each other are not transmission model independent and are not otherwise fixed.

Figure 6:
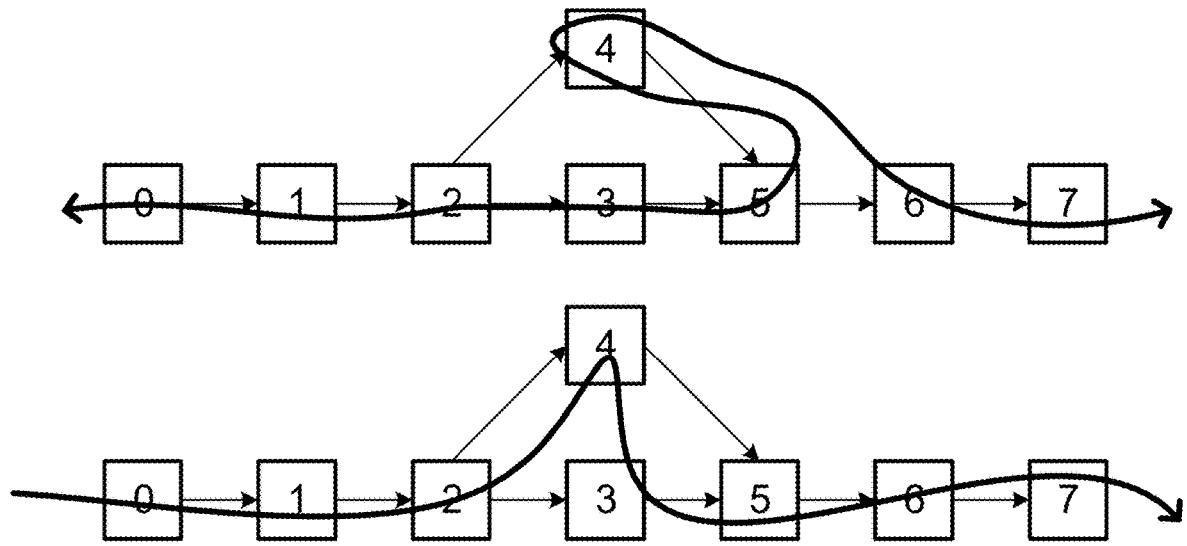
FIG. 6 includes block diagrams illustrating two possible ordered sub-channel sequences for N=8 sub-channels.

FIG. 6 includes block diagrams illustrating two possible ordered sub-channel sequences for N=8 sub-channels. An ordered sequence, also referred to herein as an ordered sub-channel sequence, is a path or chain that traverses all nodes. The ordering among nodes 3 and 4, and the sub-channels represented by those nodes, is related to such transmission model parameters or conditions as a working SNR and a specific channel type. With a partial order as shown in FIG. 5, only the relative reliabilities of nodes 3 and 4 with respect to each other are not fixed in the partial order. All other nodes in the partial order have fixed reliabilities relative to each other and all other nodes.

An ordered sub-channel sequence need not follow all edges in a partial order and may traverse between nodes that are not connected by an edge. However, ordered sub-channel sequences that do not conflict with the partial order may generally be preferred. Coding based on an ordered sub-channel sequence that does not conflict with the partial order may have better performance than similar coding that is based on a sequence that conflicts with the partial order. An ordered sub-channel sequence does not conflict with a partial order if the sequence does not traverse nodes in a manner that conflicts with a directed edge. For example, with reference to FIG. 6, the sequence at the top conflicts with the edge, and thus the reliability relationship, between nodes 4 and 5. This sequence therefore conflicts with the partial order. The sequence at the bottom in FIG. 6 follows relationships indicated by the partial order, with the addition of a traversal from node 4 to node 3, and does not conflict with the partial order. This sequence should therefore exhibit better performance than the sequence at the top in FIG. 6, and be preferred over the sequence at the top.

As noted above, the reliability relationship between nodes 3 and 4 is not fixed in the example N=8 partial order. However, the ordered sub-channel sequence at the bottom in FIG. 6 provides for polarization and better coding performance at least for Gaussian channels. A similar ordered sub-channel sequence {0, 1, 2, 3, 4, 5, 6, 7} simply follows the natural order of sub-channels. Such an ordering of sub-channels in their natural order may have significantly worse performance, especially as N increases.

Figure 7:
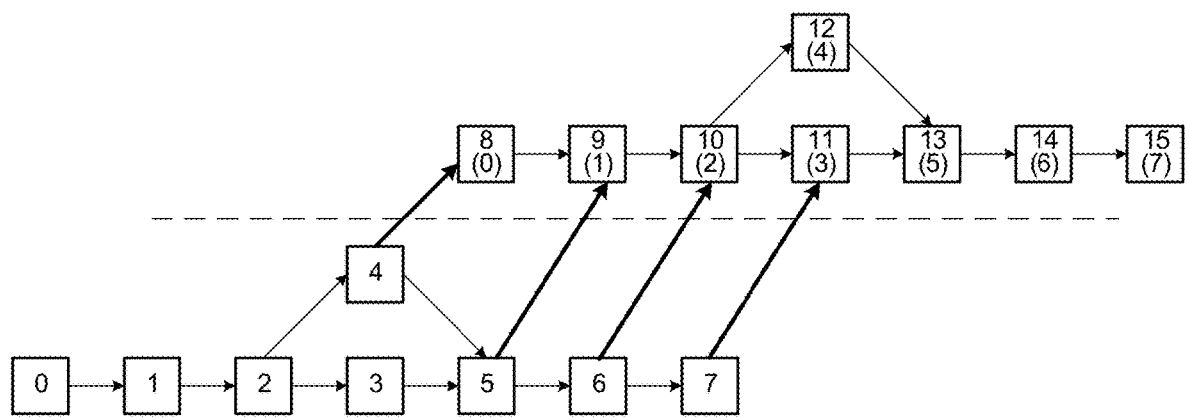
FIG. 7 is a block diagram illustrating an example partial order of N=16 sub-channels.

Consider, for example, the block diagram in FIG. 7, which illustrates an example partial order of N=16 sub-channels. FIG. 7 also illustrates how an N=8 partial order could be used as a basic element to build a larger partial order for N=16 sub-channels. In FIG. 7, a first N=8 partial order has nodes labeled with indices 0 to 7, and a second N=8 partial order has nodes labeled with indices 8 to 15, but with corresponding N=8 partial order indices also included in parentheses. The indices in parentheses are included in the second N=8 partial order to perhaps more clearly illustrate that both parts of the N=16 partial order are consistent with the N=8 basic element in this example.

The example partial order in FIG. 7 includes directed edges between the two basic N=8 partial orders, between nodes 4 and 8, between nodes 5 and 9, between nodes 6 and 10, and between nodes 7 and 11.

The example partial order for N=16 in FIG. 7 could be further extended. For example, two N=16 partial orders could be used to extend an N=16 partial order to N=32, as shown by way of example in FIG. 8. Two N=32 partial orders could similarly be used to construct an N=64 partial order, and so on, to recursively build larger partial orders.

In some embodiments, a partial order is structurally symmetric and nested. The structural symmetry of a partial order refers to a property that, for a partial order of N nodes, if a node with index i is changed to index N−1−i (for all $0 \le i \le N$) and the directions of all edges are reversed, then the resultant partial order is the same as the original partial order in terms of node and edge structure. For example, the N=32 partial order is structurally symmetric and constructed based on an N=16 partial order, which itself is also structurally symmetric and constructed based on an N=8 partial order (FIG. 7). Also, from a comparison of the N=16 and N=32 partial orders, it can be shown that nodes 0 to 15 in the N=32 partial order correspond to nodes 0 to 15 in the N=16 partial order, and nodes 16 to 31 in the N=32 partial order also have a node and edge structure consistent with the N=16 partial order. This consistency between partial orders of different sizes is referred to herein as a nested property of partial orders. The N=8 subsets in FIG. 7 are similarly consistent with the N=8 partial order node and edge structure in FIG. 5. Even the N=8 partial order in FIG. 5 could be considered structurally symmetric about a partition that splits the partial order at the edges between nodes 2 and 4 and between nodes 3 and 5, to form subsets {0, 1, 2, 3} and {4, 5, 6, 7}.

Figure 8:
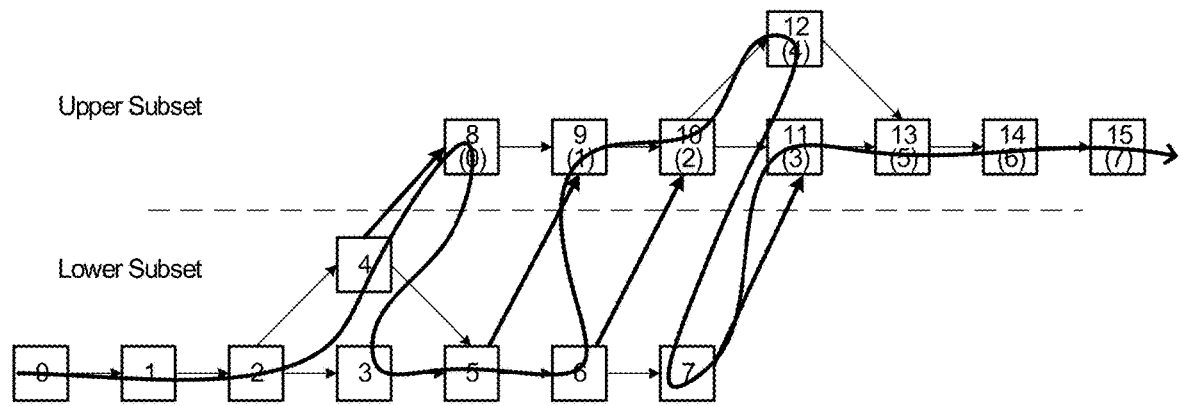
FIG. 8 is a block diagram illustrating a possible ordered sub-channel sequence for N=16 sub-channels.

Turning now to ordered sub-channel sequences, FIG. 8 is a block diagram illustrating a possible ordered sub-channel sequence for N=16 sub-channels. Embodiments of the present disclosure could be applied to generating ordered sub-channel sequences based on any of various sizes of partial order, and N=16 is used herein as a non-limiting example. Embodiments could also or instead be applied to generating ordered sub-channel sequences that are not necessarily based on partial orders.

A partial order may specify or define an order in which some nodes or sub-channels have a transmission model independent or fixed order or sequence relative to each other and all other sub-channels. Nodes 0, 1, 2 and nodes 13, 14, 15 are examples. An ordered sub-channel sequence that traverses these nodes in any other order violates the partial order. The other sub-channels in FIG. 8 are in a transmission model dependent or variable part of the partial order, and ordering of these nodes and corresponding sub-channels and bit positions may vary with transmission model parameters such as channel model and SNR, for example. Reliability computations are used to determine an order of such nodes, sub-channels, or bit positions in a complete ordered sequence.

Although a partial order does not provide a complete single ordered sub-channel sequence on its own, a partial order can provide a tendency, anchor, or pillar for the reliability distribution of sub-channels for polar code, for example. In conjunction with a partial order, a higher resolution sorting, ordering, or ranking function could be used to form a chain or determine an ordered sub-channel sequence.

In some implementations, the higher resolution function could be a metric function that is used to compute a metric for each node and/or corresponding sub-channel. Although a binary expansion function is disclosed herein by way of example, other binary expansion functions such as described in Chinese Patent Application No. CN 201610619696.5, filed on Jul. 29, 2016 referred to above could be used. Generally, any function that depends on fixed or variable parameter(s) of a given transmission model (e.g. channel type, SNR, etc.) and/or code block length can be used. As described herein, any such function can be used to for example, determine an ordered sub-channel sequence and/or to select k information sub-channels or N-k frozen sub-channels.

Like a partial order, an ordered sub-channel sequence or chain could also be symmetric and/or nested, for example, if a binary expansion associated polynomial (such as described in Chinese Patent Application No. CN 201610619696.5 referred to above) is used to compute a node or sub-channel reliability metric based upon which nodes and sub-channels are ordered. Other metric functions could be used in other embodiments.

With a nested sequence, a shorter ordered sub-channel sequence can be selected from a longer ordered sub-channel sequence. For example, an N=8 ordered sub-channel sequence can be selected by selecting sub-channel indices less than N=8 from an N=16 ordered sub-channel sequence {0,1,2,4,8,3,5,6,9,10,12,7,11,13,14,15}, which is {0,1,2,4,3,5,6,7}. In a symmetric sequence, i.e., $$seq\{i\}+seq\{N+1-i\}=N-1,$$

where i=1,2, . . . , N, and seq{i}, seq{N+1-i} are sub-channel indices of {i}th and {N+1-i}th entries in an ordered sub-channel sequence. According to this property, given one half of an ordered sub-channel sequence, a full ordered sub-channel sequence can be directly obtained and in this sense the full ordered sub-channel sequence is symmetric.

The ordered sub-channel sequence shown in FIG. 8 does not violate the partial order, and could be determined according to any of various metric or sorting/ordering functions. This illustrated sequence represents just one example, and different sequences could be determined using different functions to rank or order sub-channels, and/or for different code lengths N, different SNRs, etc.

Figure 9:
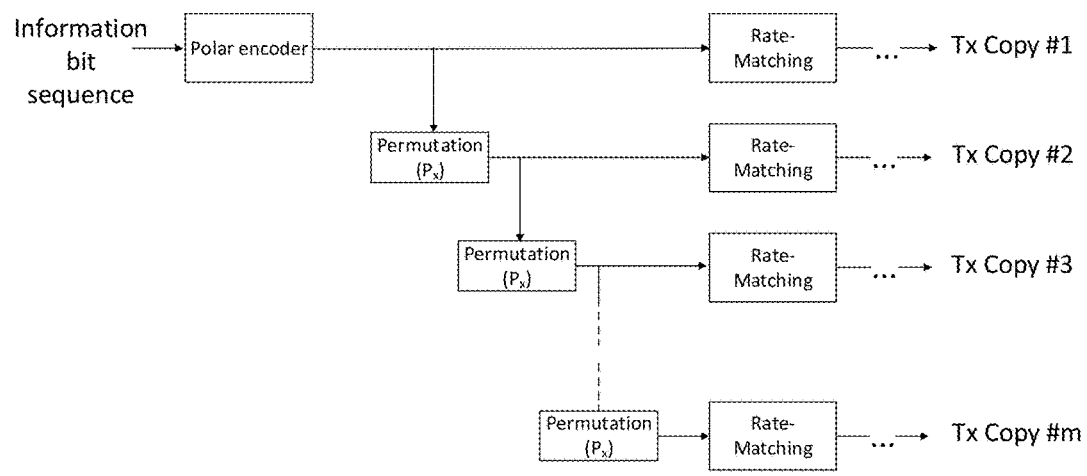
FIG. 9 is a transmission scheme with multiple copies with implicit timing index

In general, a coding chain as FIG. 9 is considered where a cumulative permutation scheme is adopted to generate each transmission copy for any kind of payload. Please note that to simplify the description, in the following of this application, even if only information bits are mentioned, these information bits or information bit sequences may or may not include CRC bits or any other kind of checked bits or any non-frozen bits.

In FIG. 9, Tx means transmission. An encoder obtains an information bit sequence and a timing index is conveyed by permutation on the coded bits. For instance, we need to convey two different timing indices like t1 (e.g. 0x01) and t2 (e.g. 0x02):

Apply 1 time permutation with pattern ($P_x$) on coded bits for convey timing index t1

Apply 2 times permutation with pattern ($P_x$) on coded bits for convey timing index t2

Apply the rate-matching as usual after the permutation.

Correspondingly, in the decoder, de-rate-matching is firstly applied. Rx means reception. Since a decoder knows the exact relative permutation offset ($\Delta t$) between ti and ti+1, it can just simply apply the de-permutation pattern ($P_x-1$) in term of $\Delta t$ to align and soft-combine with the received copies. For instance, we need to combine two different copies with timing indices like t1 (e.g. 0x01) and t2 (e.g. 0x02):

Apply 1 time de-permutation with pattern ($P_x-1$) on Rx LLR(t2)

Add the de-permutated LLR(t2) to LLR(t1)

Do the Polar decoding one time and recover the timing index by blind CRC checks

Figure 10:
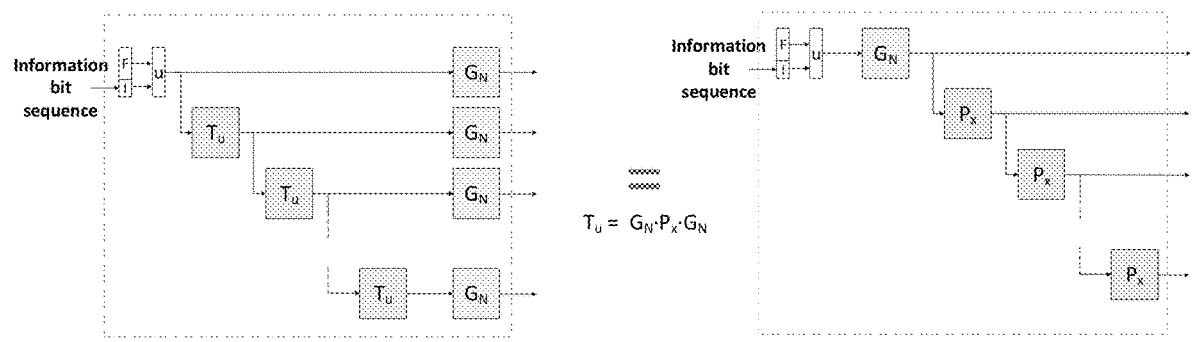
FIG. 10 is a schematic diagram to show the equivalent relation between $T_u$ and $P_x$

Actually, there is an equivalent relation between a pre-polar-encoder transform matrix ($T_u$) and post-polar-encoder permutation pattern ($P_x$) for encoding procedure, so only the de-transform operation by ($T_u-1$) need to be applied on the decoded bits before the CRC checks. (In FIG. 10, $G_N$ is polarization transformation matrix).

Note for the implicit soft combining, one time decoding is required. And about how to recover the implicit timing index, we can see that only the logical operation in de-transformation on decoded bits and CRC checks are required. Since the pre-polar-encoder transformation matrix ($T_u$) is equivalent to post-polar-encoder permutation pattern ($P_x$), the ($T_u$, $P_x$) pair is worth well-designed for low latency and good detection performance.

The rate-matching scheme is independent of the permutation. At the transmission (Tx) side, the payloads (info.+ CRC) are firstly encoded into polar code with mother code length, permutated according to the timing index, and then repeated/punctured to match the available physical resources. At the Rx side, de-rate-matching is firstly applied to recover the mother code length LLR vector and then de-permutated for soft combination and further blind detection.

Figure 11:
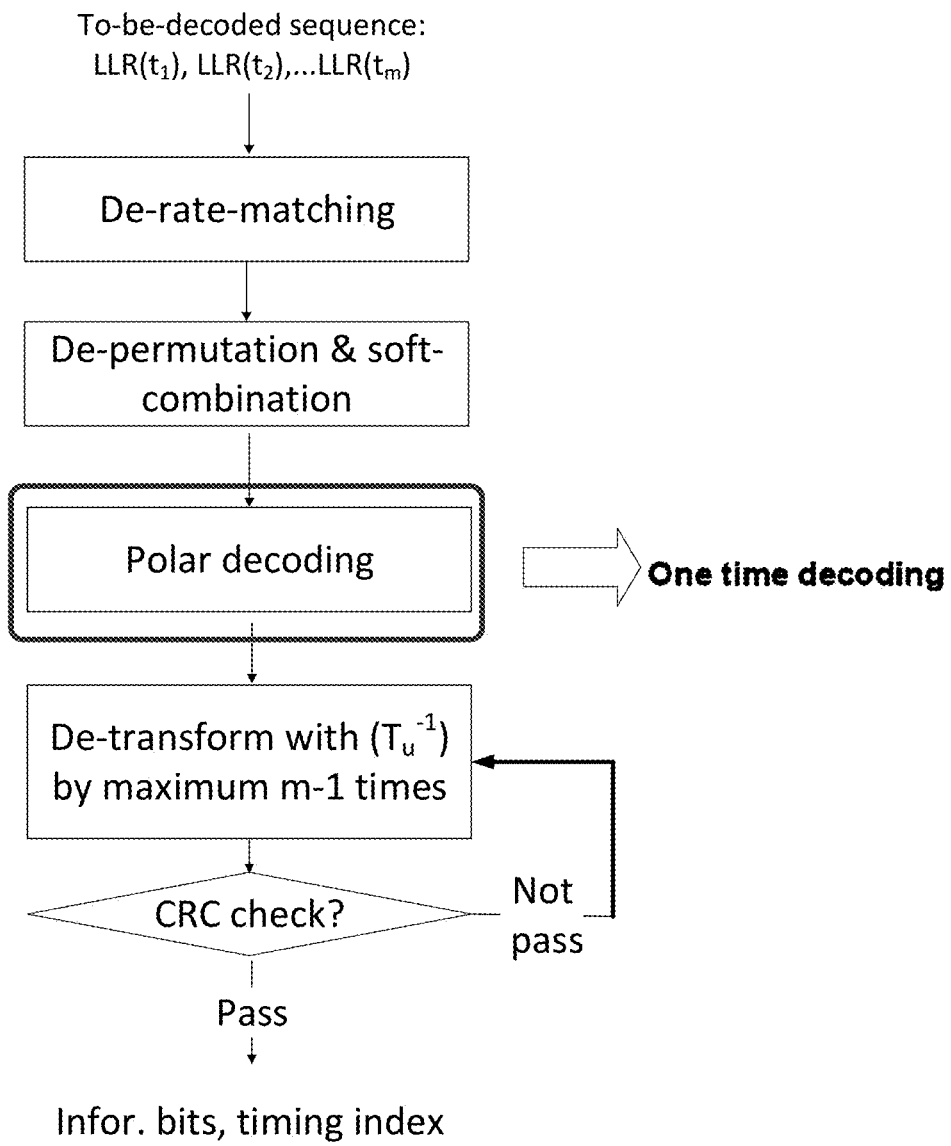
FIG. 11 is a schematic diagram to show the decoding and blind detection procedure FIG. 12 a schematic diagram to show a circular buffer to generate 4 different copies

The decoding and blind detection for timing index procedure is summarized in FIG. 11. The to-be-decoded sequence comprises the LLR information for each bit. After de-rate-matching, de-permutation & soft combination, the sequence is decoded with polar code structure. In addition, de-transform with ($T_u^{-1}$) by maximum m−1 times may be needed if the CRC check cannot be passed. And then the original information bit sequence can be recovered. Please note that it is possible to make only one polar decoding in the receive device.

Figure 12:
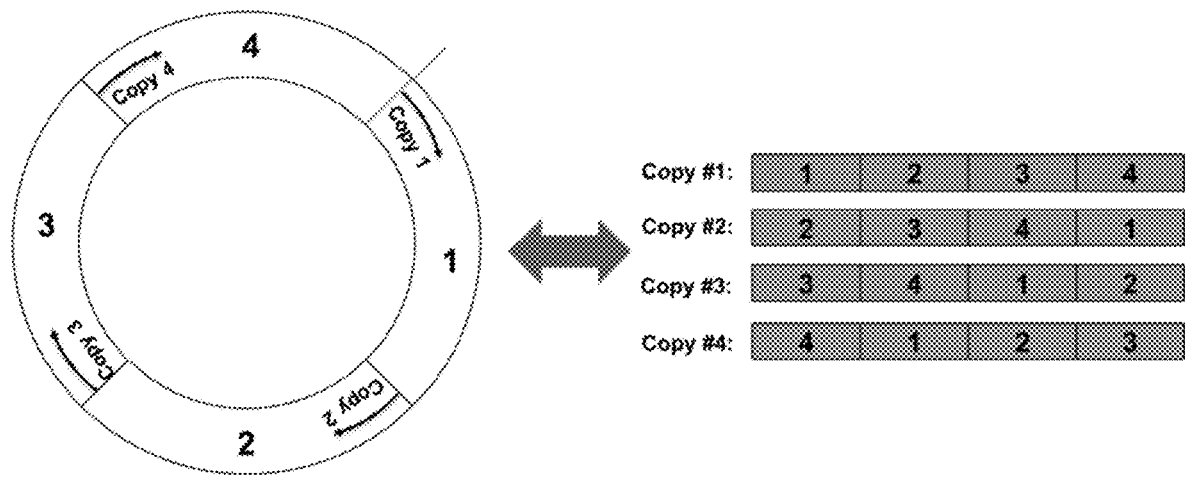

As for ($T_u$, $P_x$) pair by cyclic shift, a simple example of permutation (Px) can be provided: N/4 cyclic shift on the coded bits to support 4 different copies. The permutation Px allows a straightforward way to generate 4 copies by extracting bits from a circular buffer with a different starting positions relative offset is N/4, as shown in FIG. 12.

Figure 13:
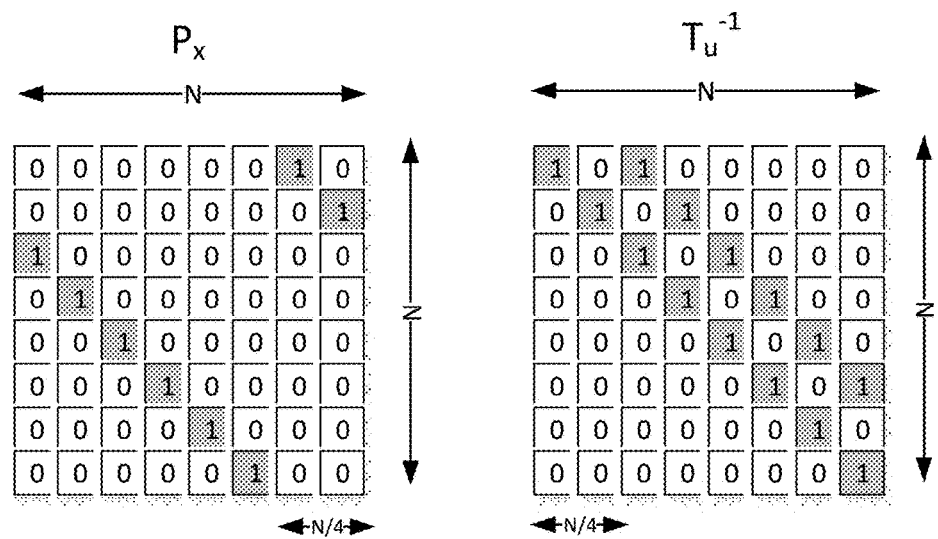
FIG. 13 is a schematic diagram to show an example of forms of $P_x$ and $T_u^{-1}$ of cyclic shift

This circular buffer is mathematically represented as multiplying $P_x$ over the coded bits vector with a two-diagonal form matrix, as shown in left side of FIG. 13. The inverse of its pre-polar-encoder transformation matrix $T_u^{-1}$ is an up-triangular matrix with a very regular and sparse form as shown in right side of FIG. 13. Note at the receiver side, $T_u^{-1}$ is applied on decoded bit vector.

The ($T_u$, $P_x$) pair of cyclic shift is very simple and with low implementation complexity. The multi-diagonal form of $T_u^{-1}$ applied on decoded vector implies that ith position will be added by jth position where j=i−N/4. According to the recursive feature of Polar code and universal partial order property, the jth position are always less reliable than the ith position, and thus, once the jth bit is info bit, the ith will always be info bit.

To achieve the capabilities to support more than four copies able to be soft-combined, here are some embodiments. Note that all methods of constructions or designs described in these embodiments may happen in both of the encoder side in a transmit device and the decoder side in a receive device. In the receive device, the de-permutation operation is corresponding to the permutation operation in the transmit device, i.e., the reverse operation with same permutation pattern. Or, the de-transform in the receive device is corresponding to the transformation mapping in the transmit device, i.e., the reverse operation with same transformation mapping pattern.

Embodiment 1: Constructing Transformation Map by Permutation

Input: Natural number m, $N=2^m$, permutation $\pi$ of set {0, 1, . . . , N−1}

Output: Transformation map $\varphi$.

Step 1: Construct polynomials $f_0, f_1, \ldots, f_{m-1}$ corresponded to 0-th, 1-st, . . . (m−1)-st rows of $M_\pi$;

Step 2: Construct transformation map by follows $$\forall J \subseteq \{0, 1, \ldots, m-1\} \quad \varphi\left(\prod_{j \in J} x_j\right) = \prod_{j \in J} f_j$$

Here is an example to explain the principle:

Let m=3, N=8 and permutation $\pi$ is quasi-cyclic shift on 4.

Scheme of the permutation will be:

$$\begin{array}{cccccccc} 0 & 1 & 2 & 3 & 4 & 5 & 6 & 7 \\ \downarrow & \downarrow & \downarrow & \downarrow & \downarrow & \downarrow & \downarrow & \downarrow \\ 4 & 5 & 6 & 7 & 0 & 1 & 2 & 3 \end{array}.$$

Construct matrix $M_\pi$ in according to permutation $\pi$:

$$M = \begin{pmatrix} 1 & 0 & 1 & 0 & 1 & 0 & 1 & 0 \\ 1 & 1 & 0 & 0 & 1 & 1 & 0 & 0 \\ 1 & 1 & 1 & 1 & 0 & 0 & 0 & 0 \end{pmatrix}$$

$$M_\pi = \begin{pmatrix} 1 & 0 & 1 & 0 & 1 & 0 & 1 & 0 \\ 1 & 1 & 0 & 0 & 1 & 1 & 0 & 0 \\ 0 & 0 & 0 & 0 & 1 & 1 & 1 & 1 \end{pmatrix};$$

Step 1: first row of $M_\pi$ is $g_6$, second row of $M_\pi$ is $g_5$ and third row of $M_\pi$ is $g_3+g_7$.

Then $f_0=x_0$, $f_1=x_1$, $f_2=x_2+1$.

Step 2: Construct transformation map $\varphi$:

$\varphi(m_0)=\varphi(x_0 \cdot x_1 \cdot x_2)=f_0 \cdot f_1 \cdot f_2=x_0 \cdot x_1 \cdot x_2 + x_0 \cdot x_1 = m_0 + m_4$ $\varphi(m_1)=\varphi(x_1 \cdot x_2)=f_1 \cdot f_2=x_1 \cdot x_2+x_1=m_1+m_5$ $\varphi(m_2)=\varphi(x_0 \cdot x_2)=f_0 \cdot f_2=x_0 \cdot x_2+x_0=m_2+m_6$ $\varphi(m_3)=\varphi(x_2)=f_2=x_2+1=m_3+m_7$ $\varphi(m_4)=\varphi(x_0 \cdot x_1)=f_0 \cdot f_1=x_0 \cdot x_1=m_4$ $\varphi(m_5)=\varphi(x_1)=f_1=x_1=m_5$ $\varphi(m_6)=\varphi(x_0)=f_0=x_0=m_6$ $\varphi(m_7)=\varphi(1)=1=m_7$ The transformation matrix Tu can be derived from the above equations as follows:

In first row of Tu, the column with indices of the subscript of m in the rightmost column are set to be 1, and the others are set to be 0. Similar rule applies for the other rows:

$$T_u = \begin{bmatrix} 1 & & & & 1 & & & \\ & 1 & & & & 1 & & \\ & & 1 & & & & 1 & \\ & & & 1 & & & & 1 \\ & & & & 1 & & & \\ & & & & & 1 & & \\ & & & & & & 1 & \\ & & & & & & & 1 \end{bmatrix}.$$

Embodiment 2: Constructing Permutation by Transformation Map

Input: Natural numbers m, $N=2^m$, transformation map $\varphi$.
Output: Permutation $\pi$.
Step 1: Construct matrix $M_\varphi$;
Step 2: For each $i \in \{0, 1, \ldots, N-1\}$ select number $j_i$ such that i-th column of M is equal to $j_i$-th column of $M_\varphi$;
Step 3: Construct permutation by follows $$\forall i \in \{0, 1, \ldots, N-1\} \; \pi(i) = j_i.$$

Here is an example to explain the principle:
Let m=3 N=8 and transformation map $\varphi$ constructed by follows:

$$\varphi(m_0) = \varphi(x_0 \cdot x_1 \cdot x_2) = x_0 \cdot x_1 \cdot x_2 + x_1 \cdot x_2 + x_0 \cdot x_1 + x_1$$

$$\varphi(m_1) = \varphi(x_1 \cdot x_2) = x_1 \cdot x_2 + x_0 \cdot x_2 + x_0 \cdot x_1 + x_1$$

$$\varphi(m_2) = \varphi(x_0 \cdot x_2) = x_0 \cdot x_2 + x_0 \cdot x_1 + x_2 + x_1$$

$$\varphi(m_3) = \varphi(x_2) = _2 + x_1$$

$$\varphi(m_4) = \varphi(x_0 \cdot x_1) = x_0 \cdot x_1 + x_1$$

$$\varphi(m_5) = \varphi(x_1) = x_1 + x_0$$

$$\varphi(m_6) = \varphi(x_0) = x_0 + 1$$

$$\varphi(m_7) = \varphi(1) = 1$$

Step 1: Construct matrix $M_\varphi$ in according to permutation $\varphi$:
first row of $M_\varphi$ is $g_6 + g_7$, second row of $M_\varphi$ is $g_5 + g_6$ and third row of $M_\varphi$ is $g_3 + g_5$:

$$M = \begin{pmatrix} 1 & 0 & 1 & 0 & 1 & 0 & 1 & 0 \\ 1 & 1 & 0 & 0 & 1 & 1 & 0 & 0 \\ 1 & 1 & 1 & 1 & 0 & 0 & 0 & 0 \end{pmatrix}$$

$$M_\varphi = \begin{pmatrix} 0 & 1 & 0 & 1 & 0 & 1 & 0 & 1 \\ 0 & 1 & 1 & 0 & 0 & 1 & 1 & 0 \\ 0 & 0 & 1 & 1 & 1 & 1 & 0 & 0 \end{pmatrix};$$

Step 2: find number $j_i$ such that i-th column of M is equal to $j_i$-th column of $M_\varphi$, $j_0=5, j_1=2, j_2=3, j_3=4, j_4=1, j_5=6, j_6=7, j_7=0$;
Step 3: Construct transformation permutation $\pi$ by formula $\pi(i) = j_i$
Hence, the scheme of the permutation is:

```
0 1 2 3 4 5 6 7
↓ ↓ ↓ ↓ ↓ ↓ ↓ ↓
5 2 3 4 1 6 7 0
```

Embodiment 3: Design Polar Code with Transformation Map

Input: Natural number m, transformation map $\varphi$.
Output: Set I for polar code C, permutation $\pi$.
Step 1: Construct permutation $\pi$ by use transformation map $\varphi$;
Step 2: Calculate the degree $d = \min\{s | \pi^s = \text{id}, s \text{ is a natural number}\}$;
Step 3: Define the "relation set" $D_i^{(0)}$ such that: $\forall i \in \{0, 1, \ldots, N-1\}$, $D_i^{(0)} := \{j \in \{0, 1, \ldots, N-1\}, m_j \text{ appears in } \varphi(m_i)\}$.
where $D_i^{(0)}$ include the set of indices of which the elements will be affected by $u_i$;
Step 4: $\forall i \in \{0, 1, \ldots, N-1\}$ assign a set $D_i^{(1)} = D_i^{(0)} \cup \{i\}$;
Step 5: For s from 2 to d do $\forall i \in \{0, 1, \ldots, N-1\}$ construct a set $D_i^{(s)}$ by follows:

$$D_i^{(s)} = \bigcup_{j \in D_i^{(s-1)}} D_j^{(s-1)}$$

Step 6: $\forall i \in \{0, 1, \ldots, N-1\}$ assign $O_i = D_i^d$;
Step 7: Construct I as union of some sets $O_i$.

A polar code can be constructed with info set I, based on which the permutation is applied on the coded bits for $0, 1, \ldots, d-1$ times to get up to d different copies to be soft-combined.

Here is an example to explain the principle to get $O_i$ with given transformation map $\varphi$:
Let m=3, N=8 and transformation map $\varphi$ are constructed by follows:

$$\varphi(m_0) = \varphi(x_0 \cdot x_1 \cdot x_2) = x_0 \cdot x_1 \cdot x_2 + x_1 \cdot x_2 + x_0 \cdot x_1 + x_1$$

$$\varphi(m_1) = \varphi(x_1 \cdot x_2) = x_1 \cdot x_2 + x_0 \cdot x_2 + x_0 \cdot x_1 + x_1$$

$$\varphi(m_2) = \varphi(x_0 \cdot x_2) = x_0 \cdot x_2 + x_0 \cdot x_1 + x_2 + x_1$$

$$\varphi(m_3) = \varphi(x_2) = _2 + x_1$$

$$\varphi(m_4) = \varphi(x_0 \cdot x_1) = x_0 \cdot x_1 + x_1$$

$$\varphi(m_5) = \varphi(x_1) = x_1 + x_0$$

$$\varphi(m_6) = \varphi(x_0) = x_0 + 1$$

$$\varphi(m_7) = \varphi(1) = 1$$

Step 1: Construct permutation $\pi$ by transformation map $\varphi$.
We have following scheme of the permutation $\pi$:

```
0 1 2 3 4 5 6 7
↓ ↓ ↓ ↓ ↓ ↓ ↓ ↓;
5 2 3 4 1 6 7 0
```

Step 2: Calculate $d = \min\{s | \pi^s = \text{id}, s \text{ is a natural number}\}$.
Consider the degrees of permutation $\pi$:
scheme of the permutation $\pi^2$:

```
0 1 2 3 4 5 6 7
↓ ↓ ↓ ↓ ↓ ↓ ↓ ↓;
6 3 4 1 2 7 0 5
``` scheme of the permutation $\pi^3$:

```
0 1 2 3 4 5 6 7
↓ ↓ ↓ ↓ ↓ ↓ ↓ ↓;
7 4 1 2 3 0 5 6
``` scheme of the permutation $\pi^4$:

$$\begin{array}{cccccccc} 0 & 1 & 2 & 3 & 4 & 5 & 6 & 7 \\ \downarrow & \downarrow & \downarrow & \downarrow & \downarrow & \downarrow & \downarrow & \downarrow \\ 0 & 1 & 2 & 3 & 4 & 5 & 6 & 7 \end{array}$$

Permutation $\pi^4$ is equal to identical permutation (id), consequently d=4;

Step 3: Define sets $D_i^{(0)}$ for all i from the set $\{0, 1, \ldots, N-1\}$:

Transformation map $\varphi$ is:

$\varphi(m_0)=\varphi(x_0 \cdot x_1 \cdot x_2)=m_0+m_1+m_4+m_5$ $\varphi(m_1)=\varphi(x_1 \cdot x_2)=m_1+m_2+m_4+m_5$ $\varphi(m_2)=\varphi(x_0 \cdot x_2)=m_2+m_4+m_3+m_5$ $\varphi(m_3)=\varphi(x_2)=m_3+m_5$, $\varphi(m_4)=\varphi(x_0 \cdot x_1)=m_4+m_5$ $\varphi(m_5)=\varphi(x_1)=m_5+m_6$ $\varphi(m_6)=\varphi(x_0)=m_6+m_7$ $\varphi(m_7)=\varphi(1)=m_7$ then we have $D_0^{(0)}=\{0,1,4,5\}$; $D_2^{(0)}=\{2,3,4,5\}$; $D_4^{(0)}=\{4,5\}$; $D_6^{(0)}=\{6,7\}$;

$D_1^{(0)}=\{1,2,4,5\}$; $D_3^{(0)}=\{3,5\}$; $D_5^{(0)}=\{5,6\}$; $D_7^{(0)}=\{7\}$.

Step 4: $\forall i \in \{0, 1, \ldots, N-1\}$ assign a set $D_i^{(1)} = D_i^{(0)} \cup \{i\}$:

$D_0^{(1)}=\{0,1,4,5\}$; $D_2^{(1)}=\{2,3,4,5\}$; $D_4^{(1)}=\{4,5\}$; $D_6^{(1)}=\{6,7\}$;

$D_1^{(1)}=\{1,2,4,5\}$; $D_3^{(1)}=\{3,5\}$; $D_5^{(1)}=\{5,6\}$; $D_7^{(1)}=\{7\}$.

$D_i^{(1)}$ indicates that in the 1st transformation, the bits of indices in $D_i^{(1)}$ will be effected by i-th bit. In other word, if i-th is info bits, all the uncoded bits of indices in $D_i^{(1)}$ should be info bits;

Step 5: For s from 2 to d do $\forall i \in \{0, 1, \ldots, N-1\}$ construct a set $D_i^{(s)}$ by follows:

$$D_i^{(s)} = \bigcup_{j \in D_i^{(s-1)}} D_j^{(s-1)}$$

If s=2 then we have $D_0^{(2)}=\{0,1,2,4,5,6\}$; $D_2^{(2)}=\{2,3,4,5,6\}$; $D_4^{(2)}=\{4,5,6\}$; $D_6^{(2)}=\{6,7\}$;

$D_1^{(2)}=\{1,2,3,4,5,6\}$; $D_3^{(2)}=\{3,5,6\}$; $D_5^{(2)}=\{5,6,7\}$; $D_7^{(2)}=\{7\}$.

If s=3 then we have $D_0^{(3)}=\{0,1,2,3,4,5,6,7\}$; $D_2^{(3)}=\{2,3,4,5,6,7\}$; $D_4^{(3)}=\{4,5,6,7\}$; $D_6^{(3)}=\{6,7\}$;

$D_1^{(3)}=\{1,2,3,4,5,6,7\}$; $D_3^{(3)}=\{3,5,6,7\}$; $D_5^{(3)}=\{5,6,7\}$; $D_7^{(3)}=\{7\}$.

If s=4 then we have $D_0^{(4)}=\{0,1,2,3,4,5,6,7\}$; $D_2^{(4)}=\{2,3,4,5,6,7\}$; $D_4^{(4)}=\{4,5,6,7\}$; $D_6^{(4)}=\{6,7\}$;

$D_1^{(4)}=\{1,2,3,4,5,6,7\}$; $D_3^{(4)}=\{3,5,6,7\}$; $D_5^{(4)}=\{5,6,7\}$; $D_7^{(4)}=\{7\}$.

After d=4 times transformation, we can find all the relations of the un-coded bits, based on which we can find several subsets of un-coded bits within which the selected bit will not affect value of bits outside the selected subset. The possible subset can be obtained with the following method.

Step 6: $\forall i \in \{0, 1, \ldots, N-1\}$ assign $O_i = D_i^d$ $O_0=\{0,1,2,3,4,5,6,7\}$; $O_2=\{2,3,4,5,6,7\}$; $O_4=\{4,5,6,7\}$; $O_6=\{6,7\}$;

$O_1=\{1,2,3,4,5,6,7\}$; $O_3=\{3,5,6,7\}$; $O_5=\{5,6,7\}$; $O_7=\{7\}$.

Step 7: Construct I as union of some sets $O_i$:

Let I is union of $O_3$ and $O_4$, i.e. I={3, 4, 5, 6, 7} We designed polar code C of length 8 and information bits 5 with permutation $\pi$.

The selection of subset $O_i$ can be either based on average reliability or worst reliability of this subset.

In other words, this relation can be explained in another way. For a given transformation matrix Tu which can support d versions, i.e., degree of d. The transformation matrix impose the relation of uncoded bits. For elements of "1" in i-th row of Tu means that the i-th bit in the uncoded bits will affect the bits with column indices of the "1" elements in this row. In order to find the relation of the uncoded bits for this cumulative transformation, we observe i-th row of d−1 matrices Tu, $Tu^2$, $Tu^3$, ..., $Tu^{d-1}$ so that we can find all the uncoded bits which will be affected by the i-th bit, of which is noted as $D_i^{(d-1)}$ in this embodiment.

Embodiment 4: Design Polar Code with Permutation

Input: Natural number m, permutation $\pi$
Output: Set I for polar code C
Step 1: Construct transformation map $\varphi$ by permutation $\pi$
Step 2: Construct the set I by using transformation map $\varphi$.

With given permutation pattern, we can calculate corresponding transformation according method 1. Then the same procedures of embodiment 3 are applied.

Embodiment 5: Design Permutations of Polar Codes Constructed by Basic Ordered Sequence Input: Natural number m, basic ordered sequence $BS^{(m)}$
Output: Permutation set with all possible permutation patterns for any Polar code C constructed by $BS^{(m)}$
Step 1: Construct set of all transformation maps $\Phi$ for which a condition satisfied:

$\forall \varphi \in \Phi \forall j \in \{\subset 0,1, \ldots, N-1\} \; O_{i_j} \subset \{i_j, i_{j+1}, \ldots, i_{N-1}\}$ Step 2: Construct the permutation set by the set $\Phi$.

Embodiment 6: Design Transformation Map for Polar Codes that Constructed by Sequence with Symmetric Property Input: Natural number m, construction sequence $BS^{(m)}$ with symmetric property.
Output: Transformation map $\varphi$.
Step 1: For all j from $\{0,1,\ldots, m-1\}$ specify number $n_j$ such that $i_{n_j}=2^m-1-2^j$, where $i_{n_j}$ is the $n_j$-th value of $BS^{(m)}$;
Step 2: For all j from $\{0,1,\ldots, m-1\}$ and for all s from $\{n_j+1, n_j+2, \ldots, 2^m-1\}$ specify $r_s^{(j)} \in \{0,1\}$;

Step 3: Set φ by follows:

$$\forall j \in \{0, 1, \ldots, m-1\} \; \varphi(x_j) = x_j + \sum_{s=n_j+1}^{2^m-1} r_s^{(j)} \cdot m_{i_s};$$

Step 4: Calculate the permutation π according to the transformation map φ, and calculate its degree d.

A polar code can be constructed with info set I based on the ordered sequence $BS^{(m)}$. Then the permutation is applied on the coded bits for $0, 1, \ldots, dr-1$ times to get up to d different copies to be soft-combined, $dr <= d$.

Here is an example to explain the principle to get transformation map φ with given symmetric ordered sequence Consider a N=8 Polar, where $BS^{(m)}$ is (0,1,2,3,4,5,6,7). It is easy to check that the sequence has symmetric property.

Step 1: find $i_{n_j}$ with m=3: $(i_6, i_5, i_3) = (6, 5, 3)$
Thus $n_j$ are as follows: $(n_0, n_1, n_2) = (6, 5, 3)$;
Step 2: For all j from $\{0, 1, \ldots, m-1\}$ and for all s from $\{n_j+1, n_j+2, \ldots, 2^m-1\}$ specify $r_s^{(j)} \in \{0, 1\}$.

For $x_0$, $n_0=6$, there are only two options for the remaining term $$\sum_{s=n_j+1}^{2^m-1} r_s^{(j)} \cdot m_{i_s};$$

For $x_1$, $n_1=5$, there are four options for the remaining term $$\sum_{s=n_j+1}^{2^m-1} r_s^{(j)} \cdot m_{i_s};$$

For $x_2$, $n_2=3$, there are 16 options for the remaining term $$\sum_{s=n_j+1}^{2^m-1} r_s^{(j)} \cdot m_{i_s};$$

There are 2×4×16=128 options in total.
Let's see one option with fixed $r_s^{(j)}$ values by follows:

$r_7^{(0)} = 0$ $r_7^{(1)} = 1 \; r_6^{(1)} = 0$ $r_7^{(2)} = 0 \; r_6^{(2)} = 0 \; r_5^{(2)} = 0 \; r_4^{(2)} = 1$

Step 3: Set φ by follows:

$\varphi(x_0) = x_0$ $\varphi(x_1) = x_1 + m_7 = x_1 + 1$ $\varphi(x_2) = x_2 + m_4 + x_4 = x_2 + x_0 \cdot x_1$ And then:

$\varphi(m_0) = \varphi(x_0 \cdot x_1 \cdot x_2) = x_0 \cdot x_1 \cdot x_2 + x_0 \cdot x_2$ $\varphi(m_1) = \varphi(x_1 \cdot x_2) = x_1 \cdot x_2 + x_2$ $\varphi(m_2) = \varphi(x_0 \cdot x_2) = x_0 \cdot x_2 + x_0 \cdot x_1$ $\varphi((m_3) = \varphi(x_2) = x_2 + x_0 \cdot x_1$ $\varphi(m_4) = \varphi(x_0 \cdot x_1) = x_0 \cdot x_1 + x_0$ $\varphi(m_5) = \varphi(x_1) = x_1 + 1$ $\varphi(m_6) = \varphi(x_0) = x_0$ $\varphi(m_7) = \varphi(1) = 1$ With the given transformation matrix, scheme of the corresponding permutation π according to method 2 is:

```
0 1 2 3 4 5 6 7
↓ ↓ ↓ ↓ ↓ ↓ ↓ ↓
2 3 4 1 6 7 0 5
```

So the permutation sequence is [2 3 4 1 6 7 0 5], and the degree of this permutation is 4.

The inverse of this permutation sequence is also applicable to achieve the same degree. The procedure of finding the inverse sequence of one given sequence is as follows: 1) sort the values of the given sequence in ascending order; 2) change index of the given sequence according to the sort in step 1); The sequence of the changed index is the inverse sequence of the give sequence.

```
index:           0 1 2 3 4 5 6 7                    sorted index:      6 3 0 1 2 7 4 5
                 ↓ ↓ ↓ ↓ ↓ ↓ ↓ ↓    ⇐ inverse ⇒   (inversed sequence) ↓ ↓ ↓ ↓ ↓ ↓ ↓ ↓
         value   2 3 4 1 6 7 0 5                    sorted value       1 2 3 4 5 6 7 8
(given sequence)
```

The inverse sequence of [2 3 4 1 6 7 0 5] is [6 3 0 1 2 7 4 5].

As an example, if a permutation pattern is adopted in the transmit device, its corresponding inverse sequence can be adopted in the receive device acting as de-permutation pattern, or vice versa.

Based on Embodiment 6, the maximum degree increases as the mother code length increases, as shown in the following table:

| m (order of Polar) | 2^m (mother code length of Polar) | d (maximum degree, up to d different copies able to be soft-combined can be supported) |
| --- | --- | --- |
| 2 | 4 | 4 |
| 3 | 8 | 4 |
| 4 | 16 | 8 |
| 5 | 32 | 8 |
| 6 | 64 | 8 |
| 7 | 128 | 8 |
| 8 | 256 | 16 |

-continued

| m (order of Polar) | 2^m (mother code length of Polar) | d (maximum degree, up to d different copies able to be soft-combined can be supported) |
|---|---|---|
| 9 | 512 | 16 |
| 10 | 1024 | 16 |

Here are 12 practical sequences with degree 16 and their inverse sequences for N=512 polar code based on Embodiment 6. That is, d=16, which means that dr different versions of permutation patterns or transformation patterns can be supported to provide dr different copies of the payload in the transmit device and the receive device for soft combining to improve performance, and dr can be up to d=16. Note 1: Permutation over the coded bits can be denoted as a sequence where if the i-th number in this sequence is j, it means that the i-th bit of an original coded bits will be in j-th position after the permutation; Note 2: Once one permutation sequence is applicable, the inverse of this sequence is also applicable with the same degree. Note 3: the given permutation patterns are equivalent to corresponding transformation patterns. These methods and found permutation patterns can be applied in any data channel or any control channel, such as PBCH. Note 4: These 12 sequences and their inverse sequences are just examples of those with degree 16. More sequences with degree 16 can be applied.

Sequence 1 (Degree 16):
[170 171 340 341 342 343 168 169 338 339 172 173 174 175 336 337 346 347 164 165 166 167 344 345 162 163 348 349 350 351 160 161 330 331 180 181 182 183 328 329 178 179 332 333 334 335 176 177 186 187 324 325 326 327 184 185 322 323 188 189 190 191 320 321 362 363 148 149 150 151 360 361 146 147 364 365 366 367 144 145 154 155 356 357 358 359 152 153 354 355 156 157 158 159 352 353 138 139 372 373 374 375 136 137 370 371 140 141 142 143 368 369 378 379 132 133 134 135 376 377 130 131 380 381 382 383 128 129 298 299 212 213 214 215 296 297 210 211 300 301 302 303 208 209 218 219 292 293 294 295 216 217 290 291 220 221 222 223 288 289 202 203 308 309 310 311 200 201 306 307 204 205 206 207 304 305 314 315 196 197 198 199 312 313 194 195 316 317 318 319 192 193 234 235 276 277 278 279 232 233 274 275 236 237 238 239 272 273 282 283 228 229 230 231 280 281 226 227 284 285 286 287 224 225 266 267 244 245 246 247 264 265 242 243 268 269 270 271 240 241 250 251 260 261 262 263 248 249 258 259 252 253 254 255 256 257 426 427 84 85 86 87 424 425 82 83 428 429 430 431 80 81 90 91 420 421 422 423 88 89 418 419 92 93 94 95 416 417 74 75 436 437 438 439 72 73 434 435 76 77 78 79 432 433 442 443 68 69 70 71 440 441 66 67 444 445 446 447 64 65 106 107 404 405 406 407 104 105 402 403 108 109 110 111 400 401 410 411 100 101 102 103 408 409 98 99 412 413 414 415 96 97 394 395 116 117 118 119 392 393 114 115 396 397 398 399 112 113 122 123 388 389 390 391 120 121 386 387 124 125 126 127 384 385 42 43 468 469 470 471 40 41 466 467 44 45 46 47 464 465 474 475 36 37 38 39 472 473 34 35 476 477 478 479 32 33 458 459 52 53 54 55 456 457 50 51 460 461 462 463 48 49 58 59 452 453 454 455 56 57 450 451 60 61 62 63 448 449 490 491 20 21 22 23 488 489 18 19 492 493 494 495 16 17 26 27 484 485 486 487 24 25 482 483 28 29 30 31 480 481 10 11 500 501 502 503 8 9 498 499 12 13 14 15 496 497 506 507 4 5 6 7 504 505 2 3 508 509 510 511 0 1];

Inverse Sequence of Sequence 1 (Degree 16):
[510 511 504 505 498 499 500 501 486 487 480 481 490 491 492 493 462 463 456 457 450 451 452 453 470 471 464 465 474 475 476 477 414 415 408 409 402 403 404 405 390 391 384 385 394 395 396 397 430 431 424 425 418 419 420 421 438 439 432 433 442 443 444 445 318 319 312 313 306 307 308 309 294 295 288 289 298 299 300 301 270 271 264 265 258 259 260 261 278 279 272 273 282 283 284 285 350 351 344 345 338 339 340 341 326 327 320 321 330 331 332 333 366 367 360 361 354 355 356 357 374 375 368 369 378 379 380 381 126 127 120 121 114 115 116 117 102 103 96 97 106 107 108 109 78 79 72 73 66 67 68 69 86 87 80 81 90 91 92 93 30 31 24 25 18 19 20 21 6 7 0 1 10 11 12 13 46 47 40 41 34 35 36 37 54 55 48 49 58 59 60 61 190 191 184 185 178 179 180 181 166 167 160 161 170 171 172 173 142 143 136 137 130 131 132 133 150 151 144 145 154 155 156 157 222 223 216 217 210 211 212 213 198 199 192 193 202 203 204 205 238 239 232 233 226 227 228 229 246 247 240 241 250 251 252 253 254 255 248 249 242 243 244 245 230 231 224 225 234 235 236 237 206 207 200 201 194 195 196 197 214 215 208 209 218 219 220 221 158 159 152 153 146 147 148 149 134 135 128 129 138 139 140 141 174 175 168 169 162 163 164 165 182 183 176 177 186 187 188 189 62 63 56 57 50 51 52 53 38 39 32 33 42 43 44 45 14 15 8 9 2 3 4 5 22 23 16 17 26 27 28 29 94 95 88 89 82 83 84 85 70 71 64 65 74 75 76 77 110 111 104 105 98 99 100 101 118 119 112 113 122 123 124 125 382 383 376 377 370 371 372 373 358 359 352 353 362 363 364 365 334 335 328 329 322 323 324 325 342 343 336 337 346 347 348 349 286 287 280 281 274 275 276 277 262 263 256 257 266 267 268 269 302 303 296 297 290 291 292 293 310 311 304 305 314 315 316 317 446 447 440 441 434 435 436 437 422 423 416 417 426 427 428 429 398 399 392 393 386 387 388 389 406 407 400 401 410 411 412 413 478 479 472 473 466 467 468 469 454 455 448 449 458 459 460 461 494 495 488 489 482 483 484 485 502 503 496 497 506 507 508 509];

Sequence 2 (Degree 16):
[169 340 171 342 341 168 343 170 337 172 339 174 173 336 175 338 345 164 347 166 165 344 167 346 161 348 163 350 349 160 351 162 329 180 331 182 181 328 183 330 177 332 179 334 333 176 335 178 185 324 187 326 325 184 327 186 321 188 323 190 189 320 191 322 361 148 363 150 149 360 151 362 145 364 147 366 365 144 367 146 153 356 155 358 357 152 359 154 353 156 355 158 157 352 159 354 137 372 139 374 373 136 375 138 369 140 371 142 141 368 143 370 377 132 379 134 133 376 135 378 129 380 131 382 381 128 383 130 297 212 299 214 213 296 215 298 209 300 211 302 301 208 303 210 217 292 219 294 293 216 295 218 289 220 291 222 221 288 223 290 201 308 203 310 309 200 311 202 305 204 307 206 205 304 207 306 313 196 315 198 197 312 199 314 193 316 195 318 317 192 319 194 233 276 235 278 277 232 279 234 273 236 275 238 237 272 239 274 281 228 283 230 229 280 231 282 225 284 227 286 285 224 287 226 265 244 267 246 245 264 247 266 241 268 243 270 269 240 271 242 249 260 251 262 261 248 263 250 257 252 259 254 253 256 255 258 425 84 427 86 85 424 87 426 81 428 83 430 429 80 431 82 89 420 91 422 421 88 423 90 417 92 419 94 93 416 95 418 73 436 75 438 437 72 439 74 433 76 435 78 77 432 79 434 441 68 443 70 69 440 71 442 65 444 67 446 445 64 447 66 105 404 107 406 405 104 407 106 401 108 403 110 109 400 111 402 409 100 411 102 101 408 103 410 97 412 99 414 413 96 415 98 393 116 395 118 117 392 119 394 113 396 115 398 397 112 399 114 121 388 123 390 389 120 391 122 385 124 387 126 125 384 127 386 41 468 43 470 469 40 471 42 465 44 467 46 45 464 47 466 473 36 475 38 37 472 39 474 33 476 35 478 477 32 479 34 457 52 459 54 53 456 55 458 49 460 51 462 461 48 463 50 57 452 59 454 453 56 455 58 449 60 451 62 61 448 63 450 489 20 491 22 21 488 23 490 17 492 19 494 493 16 495 18 25 484 27 486 485 24 487 26 481 28 483 30 29 480 31 482 9 500

11 502 501 8 503 10 497 12 499 14 13 496 15 498 505 4 507 6 5 504 7 506 1 508 3 510 509 0 511 2];

Inverse Sequence of Sequence 2 (Degree 16):
[509 504 511 506 497 500 499 502 485 480 487 482 489 492 491 494 461 456 463 458 449 452 451 454 469 464 471 466 473 476 475 478 413 408 415 410 401 404 403 406 389 384 391 386 393 396 395 398 429 424 431 426 417 420 419 422 437 432 439 434 441 444 443 446 317 312 319 314 305 308 307 310 293 288 295 290 297 300 299 302 269 264 271 266 257 260 259 262 277 272 279 274 281 284 283 286 349 344 351 346 337 340 339 342 325 320 327 322 329 332 331 334 365 360 367 362 353 356 355 358 373 368 375 370 377 380 379 382 125 120 127 122 113 116 115 118 101 96 103 98 105 108 107 110 77 72 79 74 65 68 67 70 85 80 87 82 89 92 91 94 29 24 31 26 17 20 19 22 5 0 7 2 9 12 11 14 45 40 47 42 33 36 35 38 53 48 55 50 57 60 59 62 189 184 191 186 177 180 179 182 165 160 167 162 169 172 171 174 141 136 143 138 129 132 131 134 149 144 151 146 153 156 155 158 221 216 223 218 209 212 211 214 197 192 199 194 201 204 203 206 237 232 239 234 225 228 227 230 245 240 247 242 249 252 251 254 253 248 255 250 241 244 243 246 229 224 231 226 233 236 235 238 205 200 207 202 193 196 195 198 213 208 215 210 217 220 219 222 157 152 159 154 145 148 147 150 133 128 135 130 137 140 139 142 173 168 175 170 161 164 163 166 181 176 183 178 185 188 187 190 61 56 63 58 49 52 51 54 37 32 39 34 41 44 43 46 13 8 15 10 1 4 3 6 21 16 23 18 25 28 27 30 93 88 95 90 81 84 83 86 69 64 71 66 73 76 75 78 109 104 111 106 97 100 99 102 117 112 119 114 121 124 123 126 381 376 383 378 369 372 371 374 357 352 359 354 361 364 363 366 333 328 335 330 321 324 323 326 341 336 343 338 345 348 347 350 285 280 287 282 273 276 275 278 261 256 263 258 265 268 267 270 301 296 303 298 289 292 291 294 309 304 311 306 313 316 315 318 445 440 447 442 433 436 435 438 421 416 423 418 425 428 427 430 397 392 399 394 385 388 387 390 405 400 407 402 409 412 411 414 477 472 479 474 465 468 467 470 453 448 455 450 457 460 459 462 493 488 495 490 481 484 483 486 501 496 503 498 505 508 507 510];

Sequence 3 (Degree 16):
[169 338 339 168 173 342 343 172 337 170 171 336 341 174 175 340 345 162 163 344 349 166 167 348 161 346 347 160 165 350 351 164 329 178 179 328 333 182 183 332 177 330 331 176 181 334 335 180 185 322 323 184 189 326 327 188 321 186 187 320 325 190 191 324 361 146 147 360 365 150 151 364 145 362 363 144 149 366 367 148 153 354 355 152 157 358 359 156 353 154 155 352 357 158 159 356 137 370 371 136 141 374 375 140 369 138 139 368 373 142 143 372 377 130 131 376 381 134 135 380 129 378 379 128 133 382 383 132 297 210 211 296 301 214 215 300 209 298 299 208 213 302 303 212 217 290 291 216 221 294 295 220 289 218 219 288 293 222 223 292 201 306 307 200 205 310 311 204 305 202 203 304 309 206 207 308 313 194 195 312 317 198 199 316 193 314 315 192 197 318 319 196 233 274 275 232 237 278 279 236 273 234 235 272 277 238 239 276 281 226 227 280 285 230 231 284 225 282 283 224 229 286 287 228 265 242 243 264 269 246 247 268 241 266 267 240 245 270 271 244 249 258 259 248 253 262 263 252 257 250 251 256 261 254 255 260 425 82 83 424 429 86 87 428 81 426 427 80 85 430 431 84 89 418 419 88 93 422 423 92 417 90 91 416 421 94 95 420 73 434 435 72 77 438 439 76 433 74 75 432 437 78 79 436 441 66 67 440 445 70 71 444 65 442 443 64 69 446 447 68 105 402 403 104 109 406 407 108 401 106 107 400 405 110 111 404 409 98 99 408 413 102 103 412 97 410 411 96 101 414 415 100 393 114 115 392 397 118 119 396 113 394 395 112 117 398 399 116 121 386 387 120 125 390 391 124 385 122 123 384 389 126 127 388 41 466 467 40 45 470 471 44 465 42 43 464 469 46 47 468 473 34

35 472 477 38 39 476 33 474 475 32 37 478 479 36 457 50 51 456 461 54 55 460 49 458 459 48 53 462 463 52 57 450 451 56 61 454 455 60 449 58 59 448 453 62 63 452 489 18 19 488 493 22 23 492 17 490 491 16 21 494 495 20 25 482 483 24 29 486 487 28 481 26 27 480 485 30 31 484 9 498 499 8 13 502 503 12 497 10 11 496 501 14 15 500 505 2 3 504 509 6 7 508 1 506 507 0 5 510 511 4];

Inverse Sequence of Sequence 3 (Degree 16):
[507 504 497 498 511 508 501 502 483 480 489 490 487 484 493 494 459 456 449 450 463 460 453 454 467 464 473 474 471 468 477 478 411 408 401 402 415 412 405 406 387 384 393 394 391 388 397 398 427 424 417 418 431 428 421 422 435 432 441 442 439 436 445 446 315 312 305 306 319 316 309 310 291 288 297 298 295 292 301 302 267 264 257 258 271 268 261 262 275 272 281 282 279 276 285 286 347 344 337 338 351 348 341 342 323 320 329 330 327 324 333 334 363 360 353 354 367 364 357 358 371 368 377 378 375 372 381 382 123 120 113 114 127 124 117 118 99 96 105 106 103 100 109 110 75 72 65 66 79 76 69 70 83 80 89 90 87 84 93 94 27 24 17 18 31 28 21 22 3 0 9 10 7 4 13 14 43 40 33 34 47 44 37 38 51 48 57 58 55 52 61 62 187 184 177 178 191 188 181 182 163 160 169 170 167 164 173 174 139 136 129 130 143 140 133 134 147 144 153 154 151 148 157 158 219 216 209 210 223 220 213 214 195 192 201 202 199 196 205 206 235 232 225 226 239 236 229 230 243 240 249 250 247 244 253 254 251 248 241 242 255 252 245 246 227 224 233 234 231 228 237 238 203 200 193 194 207 204 197 198 211 208 217 218 215 212 221 222 155 152 145 146 159 156 149 150 131 128 137 138 135 132 141 142 171 168 161 162 175 172 165 166 179 176 185 186 183 180 189 190 59 56 49 50 63 60 53 54 35 32 41 42 39 36 45 46 11 8 1 2 15 12 5 6 19 16 25 26 23 20 29 30 91 88 81 82 95 92 85 86 67 64 73 74 71 68 77 78 107 104 97 98 111 108 101 102 115 112 121 122 119 116 125 126 379 376 369 370 383 380 373 374 355 352 361 362 359 356 365 366 331 328 321 322 335 332 325 326 339 336 345 346 343 340 349 350 283 280 273 274 287 284 277 278 259 256 265 266 263 260 269 270 299 296 289 290 303 300 293 294 307 304 313 314 311 308 317 318 443 440 433 434 447 444 437 438 419 416 425 426 423 420 429 430 395 392 385 386 399 396 389 390 403 400 409 410 407 404 413 414 475 472 465 466 479 476 469 470 451 448 457 458 455 452 461 462 491 488 481 482 495 492 485 486 499 496 505 506 503 500 509 510];

Sequence 4 (Degree 16):
[165 338 339 164 337 166 167 336 173 346 347 172 345 174 175 344 341 162 163 340 161 342 343 160 349 170 171 348 169 350 351 168 325 178 179 324 177 326 327 176 333 186 187 332 185 334 335 184 181 322 323 180 321 182 183 320 189 330 331 188 329 190 191 328 357 146 147 356 145 358 359 144 365 154 155 364 153 366 367 152 149 354 355 148 353 150 151 352 157 362 363 156 361 158 159 360 133 370 371 132 369 134 135 368 141 378 379 140 377 142 143 376 373 130 131 372 129 374 375 128 381 138 139 380 137 382 383 136 293 210 211 292 209 294 295 208 301 218 219 300 217 302 303 216 213 290 291 212 289 214 215 288 221 298 299 220 297 222 223 296 197 306 307 196 305 198 199 304 205 314 315 204 313 206 207 312 309 194 195 308 193 310 311 192 317 202 203 316 201 318 319 200 229 274 275 228 273 230 231 272 237 282 283 236 281 238 239 280 277 226 227 276 225 278 279 224 285 234 235 284 233 286 287 232 261 242 243 260 241 262 263 240 269 250 251 268 249 270 271 248 245 258 259 244 257 246 247 256 253 266 267 252 265 254 255 264 421 82 83 420 81 422 423 80 429 90 91 428 89 430 431 88 85 418 419 84 417 86 87 416 93 426 427 92 425 94 95 424 69 434 435 68 433 70 71 432 77 442 443 76 441 78 79 440 437 66 67 436 65 438 439 64 445 74 75 444 73 446 447 72 101 402 403 100 401 102 103 400 109

410 411 108 409 110 111 408 405 98 99 404 97 406 407 96
413 106 107 412 105 414 415 104 389 114 115 388 113 390
391 112 397 122 123 396 121 398 399 120 117 386 387 116
385 118 119 384 125 394 395 124 393 126 127 392 37 466
467 36 465 38 39 464 45 474 475 44 473 46 47 472 469 34
35 468 33 470 471 32 477 42 43 476 41 478 479 40 453 50
51 452 49 454 455 48 461 58 59 460 57 462 463 56 53 450
451 52 449 54 55 448 61 458 459 60 457 62 63 456 485 18
19 484 17 486 487 16 493 26 27 492 25 494 495 24 21 482
483 20 481 22 23 480 29 490 491 28 489 30 31 488 5 498
499 4 497 6 7 496 13 506 507 12 505 14 15 504 501 2 3 500
1 502 503 0 509 10 11 508 9 510 511 8];

Inverse Sequence of Sequence 4 (Degree 16):
[503 500 497 498 483 480 485 486 511 508 505 506 491 488
493 494 455 452 449 450 467 464 469 470 463 460 457 458
475 472 477 478 407 404 401 402 387 384 389 390 415 412
409 410 395 392 397 398 423 420 417 418 435 432 437 438
431 428 425 426 443 440 445 446 311 308 305 306 291 288
293 294 319 316 313 314 299 296 301 302 263 260 257 258
275 272 277 278 271 268 265 266 283 280 285 286 343 340
337 338 323 320 325 326 351 348 345 346 331 328 333 334
359 356 353 354 371 368 373 374 367 364 361 362 379 376
381 382 119 116 113 114 99 96 101 102 127 124 121 122
107 104 109 110 71 68 65 66 83 80 85 86 79 76 73 74 91
88 93 94 23 20 17 18 3 0 5 6 31 28 25 26 11 8 13 14 39 36
33 34 51 48 53 54 47 44 41 42 59 56 61 62 183 180 177 178
163 160 165 166 191 188 185 186 171 168 173 174 135 132
129 130 147 144 149 150 143 140 137 138 155 152 157 158
215 212 209 210 195 192 197 198 223 220 217 218 203 200
205 206 231 228 225 226 243 240 245 246 239 236 233 234
251 248 253 254 247 244 241 242 227 224 229 230 255 252
249 250 235 232 237 238 199 196 193 194 211 208 213 214
207 204 201 202 219 216 221 222 151 148 145 146 131 128
133 134 159 156 153 154 139 136 141 142 167 164 161 162
179 176 181 182 175 172 169 170 187 184 189 190 55 52
49 50 35 32 37 38 63 60 57 58 43 40 45 46 7 4 1 2 19 16
21 22 15 12 9 10 27 24 29 30 87 84 81 82 67 64 69 70 95
92 89 90 75 72 77 78 103 100 97 98 115 112 117 118 111
108 105 106 123 120 125 126 375 372 369 370 355 352 357
358 383 380 377 378 363 360 365 366 327 324 321 322 339
336 341 342 335 332 329 330 347 344 349 350 279 276 273
274 259 256 261 262 287 284 281 282 267 264 269 270 295
292 289 290 307 304 309 310 303 300 297 298 315 312 317
318 439 436 433 434 419 416 421 422 447 444 441 442 427
424 429 430 391 388 385 386 403 400 405 406 399 396 393
394 411 408 413 414 471 468 465 466 451 448 453 454 479
476 473 474 459 456 461 462 487 484 481 482 499 496 501
502 495 492 489 490 507 504 509 510];

Sequence 5 (Degree 16):
[165 330 331 164 329 166 167 328 333 162 163 332 161 334
335 160 181 346 347 180 345 182 183 344 349 178 179 348
177 350 351 176 325 170 171 324 169 326 327 168 173 322
323 172 321 174 175 320 341 186 187 340 185 342 343 184
189 338 339 188 337 190 191 336 357 138 139 356 137 358
359 136 141 354 355 140 353 142 143 352 373 154 155 372
153 374 375 152 157 370 371 156 369 158 159 368 133 362
363 132 361 134 135 360 365 130 131 364 129 366 367 128
149 378 379 148 377 150 151 376 381 146 147 380 145 382
383 144 293 202 203 292 201 294 295 200 205 290 291 204
289 206 207 288 309 218 219 308 217 310 311 216 221 306
307 220 305 222 223 304 197 298 299 196 297 198 199 296
301 194 195 300 193 302 303 192 213 314 315 212 313 214
215 312 317 210 211 316 209 318 319 208 229 266 267 228
265 230 231 264 269 226 227 268 225 270 271 224 245 282
283 244 281 246 247 280 285 242 243 284 241 286 287 240
261 234 235 260 233 262 263 232 237 258 259 236 257 238
239 256 277 250 251 276 249 278 279 248 253 274 275 252

273 254 255 272 421 74 75 420 73 422 423 72 77 418 419
76 417 78 79 416 437 90 91 436 89 438 439 88 93 434 435
92 433 94 95 432 69 426 427 68 425 70 71 424 429 66 67
428 65 430 431 64 85 442 443 84 441 86 87 440 445 82 83
444 81 446 447 80 101 394 395 100 393 102 103 392 397
98 99 396 97 398 399 96 117 410 411 116 409 118 119 408
413 114 115 412 113 414 415 112 389 106 107 388 105 390
391 104 109 386 387 108 385 110 111 384 405 122 123 404
121 406 407 120 125 402 403 124 401 126 127 400 37 458
459 36 457 38 39 456 461 34 35 460 33 462 463 32 53 474
475 52 473 54 55 472 477 50 51 476 49 478 479 48 453 42
43 452 41 454 455 40 45 450 451 44 449 46 47 448 469 58
59 468 57 470 471 56 61 466 467 60 465 62 63 464 485 10
11 484 9 486 487 8 13 482 483 12 481 14 15 480 501 26 27
500 25 502 503 24 29 498 499 28 497 30 31 496 5 490 491
4 489 6 7 488 493 2 3 492 1 494 495 0 21 506 507 20 505
22 23 504 509 18 19 508 17 510 511 16];

Inverse Sequence of Sequence 5 (Degree 16):
[495 492 489 490 483 480 485 486 455 452 449 450 459 456
461 462 511 508 505 506 499 496 501 502 471 468 465 466
475 472 477 478 399 396 393 394 387 384 389 390 423 420
417 418 427 424 429 430 415 412 409 410 403 400 405 406
439 436 433 434 443 440 445 446 303 300 297 298 291 288
293 294 263 260 257 258 267 264 269 270 319 316 313 314
307 304 309 310 279 276 273 274 283 280 285 286 335 332
329 330 323 320 325 326 359 356 353 354 363 360 365 366
351 348 345 346 339 336 341 342 375 372 369 370 379 376
381 382 111 108 105 106 99 96 101 102 71 68 65 66 75 72
77 78 127 124 121 122 115 112 117 118 87 84 81 82 91 88
93 94 15 12 9 10 3 0 5 6 39 36 33 34 43 40 45 46 31 28 25
26 19 16 21 22 55 52 49 50 59 56 61 62 175 172 169 170
163 160 165 166 135 132 129 130 139 136 141 142 191 188
185 186 179 176 181 182 151 148 145 146 155 152 157 158
207 204 201 202 195 192 197 198 231 228 225 226 235 232
237 238 223 220 217 218 211 208 213 214 247 244 241 242
251 248 253 254 239 236 233 234 227 224 229 230 199 196
193 194 203 200 205 206 255 252 249 250 243 240 245 246
215 212 209 210 219 216 221 222 143 140 137 138 131 128
133 134 167 164 161 162 171 168 173 174 159 156 153 154
147 144 149 150 183 180 177 178 187 184 189 190 47 44
41 42 35 32 37 38 7 4 1 2 11 8 13 14 63 60 57 58 51 48 53
54 23 20 17 18 27 24 29 30 79 76 73 74 67 64 69 70 103
100 97 98 107 104 109 110 95 92 89 90 83 80 85 86 119 116
113 114 123 120 125 126 367 364 361 362 355 352 357 358
327 324 321 322 331 328 333 334 383 380 377 378 371 368
373 374 343 340 337 338 347 344 349 350 271 268 265 266
259 256 261 262 295 292 289 290 299 296 301 302 287 284
281 282 275 272 277 278 311 308 305 306 315 312 317 318
431 428 425 426 419 416 421 422 391 388 385 386 395 392
397 398 447 444 441 442 435 432 437 438 407 404 401 402
411 408 413 414 463 460 457 458 451 448 453 454 487 484
481 482 491 488 493 494 479 476 473 474 467 464 469 470
503 500 497 498 507 504 509 510];

Sequence 6 (Degree 16):
[149 330 331 148 329 150 151 328 333 146 147 332 145 334
335 144 325 154 155 324 153 326 327 152 157 322 323 156
321 158 159 320 181 362 363 180 361 182 183 360 365 178
179 364 177 366 367 176 357 186 187 356 185 358 359 184
189 354 355 188 353 190 191 352 341 138 139 340 137 342
343 136 141 338 339 140 337 142 143 336 133 346 347 132
345 134 135 344 349 130 131 348 129 350 351 128 373 170
171 372 169 374 375 168 173 370 371 172 369 174 175 368
165 378 379 164 377 166 167 376 381 162 163 380 161 382
383 160 277 202 203 276 201 278 279 200 205 274 275 204
273 206 207 272 197 282 283 196 281 198 199 280 285 194
195 284 193 286 287 192 309 234 235 308 233 310 311 232
237 306 307 236 305 238 239 304 229 314 315 228 313 230

231 312 317 226 227 316 225 318 319 224 213 266 267 212
265 214 215 264 269 210 211 268 209 270 271 208 261 218
219 260 217 262 263 216 221 258 259 220 257 222 223 256
245 298 299 244 297 246 247 296 301 242 243 300 241 302
303 240 293 250 251 292 249 294 295 248 253 290 291 252
289 254 255 288 405 74 75 404 73 406 407 72 77 402 403
76 401 78 79 400 69 410 411 68 409 70 71 408 413 66 67
412 65 414 415 64 437 106 107 436 105 438 439 104 109
434 435 108 433 110 111 432 101 442 443 100 441 102 103
440 445 98 99 444 97 446 447 96 85 394 395 84 393 86 87
392 397 82 83 396 81 398 399 80 389 90 91 388 89 390 391
88 93 386 387 92 385 94 95 384 117 426 427 116 425 118
119 424 429 114 115 428 113 430 431 112 421 122 123 420
121 422 423 120 125 418 419 124 417 126 127 416 21 458
459 20 457 22 23 456 461 18 19 460 17 462 463 16 453 26
27 452 25 454 455 24 29 450 451 28 449 30 31 448 53 490
491 52 489 54 55 488 493 50 51 492 49 494 495 48 485 58
59 484 57 486 487 56 61 482 483 60 481 62 63 480 469 10
11 468 9 470 471 8 13 466 467 12 465 14 15 464 5 474 475
4 473 6 7 472 477 2 3 476 1 478 479 0 501 42 43 500 41
502 503 40 45 498 499 44 497 46 47 496 37 506 507 36 505
38 39 504 509 34 35 508 33 510 511 32];

Inverse sequence of sequence 6 (degree 16):

[479 476 473 474 467 464 469 470 455 452 449 450 459
456 461 462 399 396 393 394 387 384 389 390 407 404 401
402 411 408 413 414 511 508 505 506 499 496 501 502 487
484 481 482 491 488 493 494 431 428 425 426 419 416 421
422 439 436 433 434 443 440 445 446 287 284 281 282 275
272 277 278 263 260 257 258 267 264 269 270 335 332 329
330 323 320 325 326 343 340 337 338 347 344 349 350 319
316 313 314 307 304 309 310 295 292 289 290 299 296 301
302 367 364 361 362 355 352 357 358 375 372 369 370 379
376 381 382 95 92 89 90 83 80 85 86 71 68 65 66 75 72 77
78 15 12 9 10 3 0 5 6 23 20 17 18 27 24 29 30 127 124 121
122 115 112 117 118 103 100 97 98 107 104 109 110 47 44
41 42 35 32 37 38 55 52 49 50 59 56 61 62 159 156 153 154
147 144 149 150 135 132 129 130 139 136 141 142 207 204
201 202 195 192 197 198 215 212 209 210 219 216 221 222
191 188 185 186 179 176 181 182 167 164 161 162 171 168
173 174 239 236 233 234 227 224 229 230 247 244 241 242
251 248 253 254 223 220 217 218 211 208 213 214 199 196
193 194 203 200 205 206 143 140 137 138 131 128 133 134
151 148 145 146 155 152 157 158 255 252 249 250 243 240
245 246 231 228 225 226 235 232 237 238 175 172 169 170
163 160 165 166 183 180 177 178 187 184 189 190 31 28
25 26 19 16 21 22 7 4 1 2 11 8 13 14 79 76 73 74 67 64 69
70 87 84 81 82 91 88 93 94 63 60 57 58 51 48 53 54 39 36
33 34 43 40 45 46 111 108 105 106 99 96 101 102 119 116
113 114 123 120 125 126 351 348 345 346 339 336 341 342
327 324 321 322 331 328 333 334 271 268 265 266 259 256
261 262 279 276 273 274 283 280 285 286 383 380 377 378
371 368 373 374 359 356 353 354 363 360 365 366 303 300
297 298 291 288 293 294 311 308 305 306 315 312 317 318
415 412 409 410 403 400 405 406 391 388 385 386 395 392
397 398 463 460 457 458 451 448 453 454 471 468 465 466
475 472 477 478 447 444 441 442 435 432 437 438 423 420
417 418 427 424 429 430 495 492 489 490 483 480 485 486
503 500 497 498 507 504 509 510];

Sequence 7 (Degree 16):

[149 298 299 148 297 150 151 296 301 146 147 300 145 302
303 144 293 154 155 292 153 294 295 152 157 290 291 156
289 158 159 288 309 138 139 308 137 310 311 136 141 306
307 140 305 142 143 304 133 314 315 132 313 134 135 312
317 130 131 316 129 318 319 128 213 362 363 212 361 214
215 360 365 210 211 364 209 366 367 208 357 218 219 356
217 358 359 216 221 354 355 220 353 222 223 352 373 202
203 372 201 374 375 200 205 370 371 204 369 206 207 368

197 378 379 196 377 198 199 376 381 194 195 380 193 382
383 192 277 170 171 276 169 278 279 168 173 274 275 172
273 174 175 272 165 282 283 164 281 166 167 280 285 162
163 284 161 286 287 160 181 266 267 180 265 182 183 264
269 178 179 268 177 270 271 176 261 186 187 260 185 262
263 184 189 258 259 188 257 190 191 256 341 234 235 340
233 342 343 232 237 338 339 236 337 238 239 336 229 346
347 228 345 230 231 344 349 226 227 348 225 350 351 224
245 330 331 244 329 246 247 328 333 242 243 332 241 334
335 240 325 250 251 324 249 326 327 248 253 322 323 252
321 254 255 320 405 42 43 404 41 406 407 40 45 402 403
44 401 46 47 400 37 410 411 36 409 38 39 408 413 34 35
412 33 414 415 32 53 394 395 52 393 54 55 392 397 50 51
396 49 398 399 48 389 58 59 388 57 390 391 56 61 386 387
60 385 62 63 384 469 106 107 468 105 470 471 104 109 466
467 108 465 110 111 464 101 474 475 100 473 102 103 472
477 98 99 476 97 478 479 96 117 458 459 116 457 118 119
456 461 114 115 460 113 462 463 112 453 122 123 452 121
454 455 120 125 450 451 124 449 126 127 448 21 426 427
20 425 22 23 424 429 18 19 428 17 430 431 16 421 26 27
420 25 422 423 24 29 418 419 28 417 30 31 416 437 10 11
436 9 438 439 8 13 434 435 12 433 14 15 432 5 442 443 4
441 6 7 440 445 2 3 444 1 446 447 0 85 490 491 84 489 86
87 488 493 82 83 492 81 494 495 80 485 90 91 484 89 486
487 88 93 482 483 92 481 94 95 480 501 74 75 500 73 502
503 72 77 498 499 76 497 78 79 496 69 506 507 68 505 70
71 504 509 66 67 508 65 510 511 64];

Inverse Sequence of Sequence 7 (Degree 16):

[447 444 441 442 435 432 437 438 423 420 417 418 427 424
429 430 399 396 393 394 387 384 389 390 407 404 401 402
411 408 413 414 287 284 281 282 275 272 277 278 263 260
257 258 267 264 269 270 303 300 297 298 291 288 293 294
311 308 305 306 315 312 317 318 511 508 505 506 499 496
501 502 487 484 481 482 491 488 493 494 463 460 457 458
451 448 453 454 471 468 465 466 475 472 477 478 351 348
345 346 339 336 341 342 327 324 321 322 331 328 333 334
367 364 361 362 355 352 357 358 375 372 369 370 379 376
381 382 63 60 57 58 51 48 53 54 39 36 33 34 43 40 45 46
15 12 9 10 3 0 5 6 23 20 17 18 27 24 29 30 159 156 153 154
147 144 149 150 135 132 129 130 139 136 141 142 175 172
169 170 163 160 165 166 183 180 177 178 187 184 189 190
127 124 121 122 115 112 117 118 103 100 97 98 107 104
109 110 79 76 73 74 67 64 69 70 87 84 81 82 91 88 93 94
223 220 217 218 211 208 213 214 199 196 193 194 203 200
205 206 239 236 233 234 227 224 229 230 247 244 241 242
251 248 253 254 191 188 185 186 179 176 181 182 167 164
161 162 171 168 173 174 143 140 137 138 131 128 133 134
151 148 145 146 155 152 157 158 31 28 25 26 19 16 21 22
7 4 1 2 11 8 13 14 47 44 41 42 35 32 37 38 55 52 49 50 59
56 61 62 255 252 249 250 243 240 245 246 231 228 225 226
235 232 237 238 207 204 201 202 195 192 197 198 215 212
209 210 219 216 221 222 95 92 89 90 83 80 85 86 71 68 65
66 75 72 77 78 111 108 105 106 99 96 101 102 119 116 113
114 123 120 125 126 319 316 313 314 307 304 309 310 295
292 289 290 299 296 301 302 271 268 265 266 259 256 261
262 279 276 273 274 283 280 285 286 415 412 409 410 403
400 405 406 391 388 385 386 395 392 397 398 431 428 425
426 419 416 421 422 439 436 433 434 443 440 445 446 383
380 377 378 371 368 373 374 359 356 353 354 363 360 365
366 335 332 329 330 323 320 325 326 343 340 337 338 347
344 349 350 479 476 473 474 467 464 469 470 455 452 449
450 459 456 461 462 495 492 489 490 483 480 485 486 503
500 497 498 507 504 509 510];

Sequence 8 (Degree 16):

[85 298 299 84 297 86 87 296 301 82 83 300 81 302 303 80
293 90 91 292 89 294 295 88 93 290 291 92 289 94 95 288
309 74 75 308 73 310 311 72 77 306 307 76 305 78 79 304

69 314 315 68 313 70 71 312 317 66 67 316 65 318 319 64
277 106 107 276 105 278 279 104 109 274 275 108 273 110
111 272 101 282 283 100 281 102 103 280 285 98 99 284
97 286 287 96 117 266 267 116 265 118 119 264 269 114
115 268 113 270 271 112 261 122 123 260 121 262 263 120
125 258 259 124 257 126 127 256 213 426 427 212 425 214
215 424 429 210 211 428 209 430 431 208 421 218 219 420
217 422 423 216 221 418 419 220 417 222 223 416 437 202
203 436 201 438 439 200 205 434 435 204 433 206 207 432
197 442 443 196 441 198 199 440 445 194 195 444 193 446
447 192 405 234 235 404 233 406 407 232 237 402 403 236
401 238 239 400 229 410 411 228 409 230 231 408 413 226
227 412 225 414 415 224 245 394 395 244 393 246 247 392
397 242 243 396 241 398 399 240 389 250 251 388 249 390
391 248 253 386 387 252 385 254 255 384 341 42 43 340
41 342 343 40 45 338 339 44 337 46 47 336 37 346 347 36
345 38 39 344 349 34 35 348 33 350 351 32 53 330 331 52
329 54 55 328 333 50 51 332 49 334 335 48 325 58 59 324
57 326 327 56 61 322 323 60 321 62 63 320 21 362 363 20
361 22 23 360 365 18 19 364 17 366 367 16 357 26 27 356
25 358 359 24 29 354 355 28 353 30 31 352 373 10 11 372
9 374 375 8 13 370 371 12 369 14 15 368 5 378 379 4 377
6 7 376 381 2 3 380 1 382 383 0 469 170 171 468 169 470
471 168 173 466 467 172 465 174 175 464 165 474 475 164
473 166 167 472 477 162 163 476 161 478 479 160 181 458
459 180 457 182 183 456 461 178 179 460 177 462 463 176
453 186 187 452 185 454 455 184 189 450 451 188 449 190
191 448 149 490 491 148 489 150 151 488 493 146 147 492
145 494 495 144 485 154 155 484 153 486 487 152 157 482
483 156 481 158 159 480 501 138 139 500 137 502 503 136
141 498 499 140 497 142 143 496 133 506 507 132 505 134
135 504 509 130 131 508 129 510 511 128];

Inverse Sequence of Sequence 8 (Degree 16):
[383 380 377 378 371 368 373 374 359 356 353 354 363 360
365 366 335 332 329 330 323 320 325 326 343 340 337 338
347 344 349 350 287 284 281 282 275 272 277 278 263 260
257 258 267 264 269 270 303 300 297 298 291 288 293 294
311 308 305 306 315 312 317 318 63 60 57 58 51 48 53 54
39 36 33 34 43 40 45 46 15 12 9 10 3 0 5 6 23 20 17 18 27
24 29 30 95 92 89 90 83 80 85 86 71 68 65 66 75 72 77 78
111 108 105 106 99 96 101 102 119 116 113 114 123 120
125 126 511 508 505 506 499 496 501 502 487 484 481 482
491 488 493 494 463 460 457 458 451 448 453 454 471 468
465 466 475 472 477 478 415 412 409 410 403 400 405 406
391 388 385 386 395 392 397 398 431 428 425 426 419 416
421 422 439 436 433 434 443 440 445 446 191 188 185 186
179 176 181 182 167 164 161 162 171 168 173 174 143 140
137 138 131 128 133 134 151 148 145 146 155 152 157 158
223 220 217 218 211 208 213 214 199 196 193 194 203 200
205 206 239 236 233 234 227 224 229 230 247 244 241 242
251 248 253 254 127 124 121 122 115 112 117 118 103 100
97 98 107 104 109 110 79 76 73 74 67 64 69 70 87 84 81
82 91 88 93 94 31 28 25 26 19 16 21 22 7 4 1 2 11 8 13 14
47 44 41 42 35 32 37 38 55 52 49 50 59 56 61 62 319 316
313 314 307 304 309 310 295 292 289 290 299 296 301 302
271 268 265 266 259 256 261 262 279 276 273 274 283 280
285 286 351 348 345 346 339 336 341 342 327 324 321 322
331 328 333 334 367 364 361 362 355 352 357 358 375 372
369 370 379 376 381 382 255 252 249 250 243 240 245 246
231 228 225 226 235 232 237 238 207 204 201 202 195 192
197 198 215 212 209 210 219 216 221 222 159 156 153 154
147 144 149 150 135 132 129 130 139 136 141 142 175 172
169 170 163 160 165 166 183 180 177 178 187 184 189 190
447 444 441 442 435 432 437 438 423 420 417 418 427 424
429 430 399 396 393 394 387 384 389 390 407 404 401 402
411 408 413 414 479 476 473 474 467 464 469 470 455 452
449 450 459 456 461 462 495 492 489 490 483 480 485 486
503 500 497 498 507 504 509 510];

Sequence 9 (Degree 16):
[85 170 171 84 169 86 87 168 173 82 83 172 81 174 175 80
165 90 91 164 89 166 167 88 93 162 163 92 161 94 95 160
181 74 75 180 73 182 183 72 77 178 179 76 177 78 79 176
69 186 187 68 185 70 71 184 189 66 67 188 65 190 191 64
149 106 107 148 105 150 151 104 109 146 147 108 145 110
111 144 101 154 155 100 153 102 103 152 157 98 99 156
97 158 159 96 117 138 139 116 137 118 119 136 141 114
115 140 113 142 143 112 133 122 123 132 121 134 135 120
125 130 131 124 129 126 127 128 213 42 43 212 41 214 215
40 45 210 211 44 209 46 47 208 37 218 219 36 217 38 39
216 221 34 35 220 33 222 223 32 53 202 203 52 201 54 55
200 205 50 51 204 49 206 207 48 197 58 59 196 57 198 199
56 61 194 195 60 193 62 63 192 21 234 235 20 233 22 23
232 237 18 19 236 17 238 239 16 229 26 27 228 25 230 231
24 29 226 227 28 225 30 31 224 245 10 11 244 9 246 247
8 13 242 243 12 241 14 15 240 5 250 251 4 249 6 7 248 253
2 3 252 1 254 255 0 341 426 427 340 425 342 343 424 429
338 339 428 337 430 431 336 421 346 347 420 345 422 423
344 349 418 419 348 417 350 351 416 437 330 331 436 329
438 439 328 333 434 435 332 433 334 335 432 325 442 443
324 441 326 327 440 445 322 323 444 321 446 447 320 405
362 363 404 361 406 407 360 365 402 403 364 401 366 367
400 357 410 411 356 409 358 359 408 413 354 355 412 353
414 415 352 373 394 395 372 393 374 375 392 397 370 371
396 369 398 399 368 389 378 379 388 377 390 391 376 381
386 387 380 385 382 383 384 469 298 299 468 297 470 471
296 301 466 467 300 465 302 303 464 293 474 475 292 473
294 295 472 477 290 291 476 289 478 479 288 309 458 459
308 457 310 311 456 461 306 307 460 305 462 463 304 453
314 315 452 313 454 455 312 317 450 451 316 449 318 319
448 277 490 491 276 489 278 279 488 493 274 275 492 273
494 495 272 485 282 283 484 281 486 487 280 285 482 483
284 481 286 287 480 501 266 267 500 265 502 503 264 269
498 499 268 497 270 271 496 261 506 507 260 505 262 263
504 509 258 259 508 257 510 511 256];

Inverse Sequence of Sequence 9 (Degree 16):
[255 252 249 250 243 240 245 246 231 228 225 226 235 232
237 238 207 204 201 202 195 192 197 198 215 212 209 210
219 216 221 222 159 156 153 154 147 144 149 150 135 132
129 130 139 136 141 142 175 172 169 170 163 160 165 166
183 180 177 178 187 184 189 190 63 60 57 58 51 48 53 54
39 36 33 34 43 40 45 46 15 12 9 10 3 0 5 6 23 20 17 18 27
24 29 30 95 92 89 90 83 80 85 86 71 68 65 66 75 72 77 78
111 108 105 106 99 96 101 102 119 116 113 114 123 120
125 126 127 124 121 122 115 112 117 118 103 100 97 98
107 104 109 110 79 76 73 74 67 64 69 70 87 84 81 82 91
88 93 94 31 28 25 26 19 16 21 22 7 4 1 2 11 8 13 14 47 44
41 42 35 32 37 38 55 52 49 50 59 56 61 62 191 188 185 186
179 176 181 182 167 164 161 162 171 168 173 174 143 140
137 138 131 128 133 134 151 148 145 146 155 152 157 158
223 220 217 218 211 208 213 214 199 196 193 194 203 200
205 206 239 236 233 234 227 224 229 230 247 244 241 242
251 248 253 254 511 508 505 506 499 496 501 502 487 484
481 482 491 488 493 494 463 460 457 458 451 448 453 454
471 468 465 466 475 472 477 478 415 412 409 410 403 400
405 406 391 388 385 386 395 392 397 398 431 428 425 426
419 416 421 422 439 436 433 434 443 440 445 446 319 316
313 314 307 304 309 310 295 292 289 290 299 296 301 302
271 268 265 266 259 256 261 262 279 276 273 274 283 280
285 286 351 348 345 346 339 336 341 342 327 324 321 322
331 328 333 334 367 364 361 362 355 352 357 358 375 372
369 370 379 376 381 382 383 380 377 378 371 368 373 374
359 356 353 354 363 360 365 366 335 332 329 330 323 320
325 326 343 340 337 338 347 344 349 350 287 284 281 282

275 272 277 278 263 260 257 258 267 264 269 270 303 300 297 298 291 288 293 294 311 308 305 306 315 312 317 318 447 444 441 442 435 432 437 438 423 420 417 418 427 424 429 430 399 396 393 394 387 384 389 390 407 404 401 402 411 408 413 414 479 476 473 474 467 464 469 470 455 452 449 450 459 456 461 462 495 492 489 490 483 480 485 486 503 500 497 498 507 504 509 510];

Sequence 10 (Degree 16):
[170 341 340 171 342 169 168 343 338 173 172 339 174 337 336 175 346 165 164 347 166 345 344 167 162 349 348 163 350 161 160 351 330 181 180 331 182 329 328 183 178 333 332 179 334 177 176 335 186 325 324 187 326 185 184 327 322 189 188 323 190 321 320 191 362 149 148 363 150 361 360 151 146 365 364 147 366 145 144 367 154 357 356 155 358 153 152 359 354 157 156 355 158 353 352 159 138 373 372 139 374 137 136 375 370 141 140 371 142 369 368 143 378 133 132 379 134 377 376 135 130 381 380 131 382 129 128 383 298 213 212 299 214 297 296 215 210 301 300 211 302 209 208 303 218 293 292 219 294 217 216 295 290 221 220 291 222 289 288 223 202 309 308 203 310 201 200 311 306 205 204 307 206 305 304 207 314 197 196 315 198 313 312 199 194 317 316 195 318 193 192 319 234 277 276 235 278 233 232 279 274 237 236 275 238 273 272 239 282 229 228 283 230 281 280 231 226 285 284 227 286 225 224 287 266 245 244 267 246 265 264 247 242 269 268 243 270 241 240 271 250 261 260 251 262 249 248 263 258 253 252 259 254 257 256 255 426 85 84 427 86 425 424 87 82 429 428 83 430 81 80 431 90 421 420 91 422 89 88 423 418 93 92 419 94 417 416 95 74 437 436 75 438 73 72 439 434 77 76 435 78 433 432 79 442 69 68 443 70 441 440 71 66 445 444 67 446 65 64 447 106 405 404 107 406 105 104 407 402 109 108 403 110 401 400 111 410 101 100 411 102 409 408 103 98 413 412 99 414 97 96 415 394 117 116 395 118 393 392 119 114 397 396 115 398 113 112 399 122 389 388 123 390 121 120 391 386 125 124 387 126 385 384 127 42 469 468 43 470 41 40 471 466 45 44 467 46 465 464 47 474 37 36 475 38 473 472 39 34 477 476 35 478 33 32 479 458 53 52 459 54 457 456 55 50 461 460 51 462 49 48 463 58 453 452 59 454 57 56 455 450 61 60 451 62 449 448 63 490 21 20 491 22 489 488 23 18 493 492 19 494 17 16 495 26 485 484 27 486 25 24 487 482 29 28 483 30 481 480 31 10 501 500 11 502 9 8 503 498 13 12 499 14 497 496 15 506 5 4 507 6 505 504 7 2 509 508 3 510 1 0 511];

Inverse Sequence of Sequence 10 (Degree 16):
[510 509 504 507 498 497 500 503 486 485 480 483 490 489 492 495 462 461 456 459 450 449 452 455 470 469 464 467 474 473 476 479 414 413 408 411 402 401 404 407 390 389 384 387 394 393 396 399 430 429 424 427 418 417 420 423 438 437 432 435 442 441 444 447 318 317 312 315 306 305 308 311 294 293 288 291 298 297 300 303 270 269 264 267 258 257 260 263 278 277 272 275 282 281 284 287 350 349 344 347 338 337 340 343 326 325 320 323 330 329 332 335 366 365 360 363 354 353 356 359 374 373 368 371 378 377 380 383 126 125 120 123 114 113 116 119 102 101 96 99 106 105 108 111 78 77 72 75 66 65 68 71 86 85 80 83 90 89 92 95 30 29 24 27 18 17 20 23 6 5 0 3 10 9 12 15 46 45 40 43 34 33 36 39 54 53 48 51 58 57 60 63 190 189 184 187 178 177 180 183 166 165 160 163 170 169 172 175 142 141 136 139 130 129 132 135 150 149 144 147 154 153 156 159 222 221 216 219 210 209 212 215 198 197 192 195 202 201 204 207 238 237 232 235 226 225 228 231 246 245 240 243 250 249 252 255 254 253 248 251 242 241 244 247 230 229 224 227 234 233 236 239 206 205 200 203 194 193 196 199 214 213 208 211 218 217 220 223 158 157 152 155 146 145 148 151 134 133 128 131 138 137 140 143 174 173 168 171 162 161 164 167 182 181 176 179 186 185 188 191 62 61 56 59 50 49 52 55 38 37 32 35 42 41 44 47 14 13 8 112 14

7 22 21 16 19 26 25 28 31 94 93 88 91 82 81 84 87 70 69 64 67 74 73 76 79 110 109 104 107 98 97 100 103 118 117 112 115 122 121 124 127 382 381 376 379 370 369 372 375 358 357 352 355 362 361 364 367 334 333 328 331 322 321 324 327 342 341 336 339 346 345 348 351 286 285 280 283 274 273 276 279 262 261 256 259 266 265 268 271 302 301 296 299 290 289 292 295 310 309 304 307 314 313 316 319 446 445 440 443 434 433 436 439 422 421 416 419 426 425 428 431 398 397 392 395 386 385 388 391 406 405 400 403 410 409 412 415 478 477 472 475 466 465 468 471 454 453 448 451 458 457 460 463 494 493 488 491 482 481 484 487 502 501 496 499 506 505 508 511];

Sequence 11 (Degree 16):
[341 170 171 340 169 342 343 168 173 338 339 172 337 174 175 336 165 346 347 164 345 166 167 344 349 162 163 348 161 350 351 160 181 330 331 180 329 182 183 328 333 178 179 332 177 334 335 176 325 186 187 324 185 326 327 184 189 322 323 188 321 190 191 320 149 362 363 148 361 150 151 360 365 146 147 364 145 366 367 144 357 154 155 356 153 358 359 152 157 354 355 156 353 158 159 352 373 138 139 372 137 374 375 136 141 370 371 140 369 142 143 368 133 378 379 132 377 134 135 376 381 130 131 380 129 382 383 128 213 298 299 212 297 214 215 296 301 210 211 300 209 302 303 208 293 218 219 292 217 294 295 216 221 290 291 220 289 222 223 288 309 202 203 308 201 310 311 200 205 306 307 204 305 206 207 304 197 314 315 196 313 198 199 312 317 194 195 316 193 318 319 192 277 234 235 276 233 278 279 232 237 274 275 236 273 238 239 272 229 282 283 228 281 230 231 280 285 226 227 284 225 286 287 224 245 266 267 244 265 246 247 264 269 242 243 268 241 270 271 240 261 250 251 260 249 262 263 248 253 258 259 252 257 254 255 256 85 426 427 84 425 86 87 424 429 82 83 428 81 430 431 80 421 90 91 420 89 422 423 88 93 418 419 92 417 94 95 416 437 74 75 436 73 438 439 72 77 434 435 76 433 78 79 432 69 442 443 68 441 70 71 440 445 66 67 444 65 446 447 64 405 106 107 404 105 406 407 104 109 402 403 108 401 110 111 400 101 410 411 100 409 102 103 408 413 98 99 412 97 414 415 96 117 394 395 116 393 118 119 392 397 114 115 396 113 398 399 112 389 122 123 388 121 390 391 120 125 386 387 124 385 126 127 384 469 42 43 468 41 470 471 40 45 466 467 44 465 46 47 464 37 474 475 36 473 38 39 472 477 34 35 476 33 478 479 32 53 458 459 52 457 54 55 456 461 50 51 460 49 462 463 48 453 58 59 452 57 454 455 56 61 450 451 60 449 62 63 448 21 490 491 20 489 22 23 488 493 18 19 492 17 494 495 16 485 26 27 484 25 486 487 24 29 482 483 28 481 30 31 480 501 10 11 500 9 502 503 8 13 498 499 12 497 14 15 496 5 506 507 4 505 6 7 504 509 2 3 508 1 510 511 0];

Inverse Sequence of Sequence 11 (Degree 16):
[511 508 505 506 499 496 501 502 487 484 481 482 491 488 493 494 463 460 457 458 451 448 453 454 471 468 465 466 475 472 477 478 415 412 409 410 403 400 405 406 391 388 385 386 395 392 397 398 431 428 425 426 419 416 421 422 439 436 433 434 443 440 445 446 319 316 313 314 307 304 309 310 295 292 289 290 299 296 301 302 271 268 265 266 259 256 261 262 279 276 273 274 283 280 285 286 351 348 345 346 339 336 341 342 327 324 321 322 331 328 333 334 367 364 361 362 355 352 357 358 375 372 369 370 379 376 381 382 127 124 121 122 115 112 117 118 103 100 97 98 107 104 109 110 79 76 73 74 67 64 69 70 87 84 81 82 91 88 93 94 31 28 25 26 19 16 21 22 7 4 1 2 11 8 13 14 47 44 41 42 35 32 37 38 55 52 49 50 59 56 61 62 191 188 185 186 179 176 181 182 167 164 161 162 171 168 173 174 143 140 137 138 131 128 133 134 151 148 145 146 155 152 157 158 223 220 217 218 211 208 213 214 199 196 193 194 203 200 205 206 239 236 233 234 227 224 229 230 247 244 241 242 251 248 253 254 255 252 249 250 243 240 245 246 231 228

225 226 235 232 237 238 207 204 201 202 195 192 197 198
215 212 209 210 219 216 221 222 159 156 153 154 147 144
149 150 135 132 129 130 139 136 141 142 175 172 169 170
163 160 165 166 183 180 177 178 187 184 189 190 63 60
57 58 51 48 53 54 39 36 33 34 43 40 45 46 15 12 9 10 3 0
5 6 23 20 17 18 27 24 29 30 95 92 89 90 83 80 85 86 71 68
65 66 75 72 77 78 111 108 105 106 99 96 101 102 119 116
113 114 123 120 125 126 383 380 377 378 371 368 373 374
359 356 353 354 363 360 365 366 335 332 329 330 323 320
325 326 343 340 337 338 347 344 349 350 287 284 281 282
275 272 277 278 263 260 257 258 267 264 269 270 303 300
297 298 291 288 293 294 311 308 305 306 315 312 317 318
447 444 441 442 435 432 437 438 423 420 417 418 427 424
429 430 399 396 393 394 387 384 389 390 407 404 401 402
411 408 413 414 479 476 473 474 467 464 469 470 455 452
449 450 459 456 461 462 495 492 489 490 483 480 485 486
503 500 497 498 507 504 509 510];

Sequence 12 (Degree 16):
[85 170 171 340 169 86 87 424 173 82 83 428 81 174 175
336 165 90 91 420 89 166 167 344 93 162 163 348 161 94
95 416 181 74 75 436 73 182 183 328 77 178 179 332 177
78 79 432 69 186 187 324 185 70 71 440 189 66 67 444 65
190 191 320 149 106 107 404 105 150 151 360 109 146 147
364 145 110 111 400 101 154 155 356 153 102 103 408 157
98 99 412 97 158 159 352 117 138 139 372 137 118 119 392
141 114 115 396 113 142 143 368 133 122 123 388 121 134
135 376 125 130 131 380 129 126 127 384 213 42 43 468
41 214 215 296 45 210 211 300 209 46 47 464 37 218 219
292 217 38 39 472 221 34 35 476 33 222 223 288 53 202
203 308 201 54 55 456 205 50 51 460 49 206 207 304 197
58 59 452 57 198 199 312 61 194 195 316 193 62 63 448
21 234 235 276 233 22 23 488 237 18 19 492 17 238 239
272 229 26 27 484 25 230 231 280 29 226 227 284 225 30
31 480 245 10 11 500 9 246 247 264 13 242 243 268 241
14 15 496 5 250 251 260 249 6 7 504 253 2 3 508 1 254 255
256 341 426 427 84 425 342 343 168 429 338 339 172 337
430 431 80 421 346 347 164 345 422 423 88 349 418 419
92 417 350 351 160 437 330 331 180 329 438 439 72 333
434 435 76 433 334 335 176 325 442 443 68 441 326 327
184 445 322 323 188 321 446 447 64 405 362 363 148 361
406 407 104 365 402 403 108 401 366 367 144 357 410 411
100 409 358 359 152 413 354 355 156 353 414 415 96 373
394 395 116 393 374 375 136 397 370 371 140 369 398 399
112 389 378 379 132 377 390 391 120 381 386 387 124 385
382 383 128 469 298 299 212 297 470 471 40 301 466 467
44 465 302 303 208 293 474 475 36 473 294 295 216 477
290 291 220 289 478 479 32 309 458 459 52 457 310 311
200 461 306 307 204 305 462 463 48 453 314 315 196 313
454 455 56 317 450 451 60 449 318 319 192 277 490 491
20 489 278 279 232 493 274 275 236 273 494 495 16 485
282 283 228 281 486 487 24 285 482 483 28 481 286 287
224 501 266 267 244 265 502 503 8 269 498 499 12 497 270
271 240 261 506 507 4 505 262 263 248 509 258 259 252
257 510 511 0];

Inverse Sequence of Sequence 12 (Degree 16):
[511 252 249 250 499 240 245 246 487 228 225 226 491 232
237 238 463 204 201 202 451 192 197 198 471 212 209 210
475 216 221 222 415 156 153 154 403 144 149 150 391 132
129 130 395 136 141 142 431 172 169 170 419 160 165 166
439 180 177 178 443 184 189 190 319 60 57 58 307 48 53
54 295 36 33 34 299 40 45 46 271 12 9 10 259 0 5 6 279
20 17 18 283 24 29 30 351 92 89 90 339 80 85 86 327 68
65 66 331 72 77 78 367 108 105 106 355 96 101 102 375
116 113 114 379 120 125 126 383 124 121 122 371 112 117
118 359 100 97 98 363 104 109 110 335 76 73 74 323 64
69 70 343 84 81 82 347 88 93 94 287 28 25 26 275 16 21
22 263 4 1 2 267 8 13 14 303 44 41 42 291 32 37 38 311

52 49 50 315 56 61 62 447 188 185 186 435 176 181 182
423 164 161 162 427 168 173 174 399 140 137 138 387 128
133 134 407 148 145 146 411 152 157 158 479 220 217 218
467 208 213 214 455 196 193 194 459 200 205 206 495 236
233 234 483 224 229 230 503 244 241 242 507 248 253 254
255 508 505 506 243 496 501 502 231 484 481 482 235 488
493 494 207 460 457 458 195 448 453 454 215 468 465 466
219 472 477 478 159 412 409 410 147 400 405 406 135 388
385 386 139 392 397 398 175 428 425 426 163 416 421 422
183 436 433 434 187 440 445 446 63 316 313 314 51 304
309 310 39 292 289 290 43 296 301 302 15 268 265 266 3
256 261 262 23 276 273 274 27 280 285 286 95 348 345 346
83 336 341 342 71 324 321 322 75 328 333 334 111 364 361
362 99 352 357 358 119 372 369 370 123 376 381 382 127
380 377 378 115 368 373 374 103 356 353 354 107 360 365
366 79 332 329 330 67 320 325 326 87 340 337 338 91 344
349 350 31 284 281 282 19 272 277 278 7 260 257 258 11
264 269 270 47 300 297 298 35 288 293 294 55 308 305 306
59 312 317 318 191 444 441 442 179 432 437 438 167 420
417 418 171 424 429 430 143 396 393 394 131 384 389 390
151 404 401 402 155 408 413 414 223 476 473 474 211 464
469 470 199 452 449 450 203 456 461 462 239 492 489 490
227 480 485 486 247 500 497 498 251 504 509 510].

In another embodiment, a non-transitory processor-readable medium stores instructions which, when executed by one or more processors, cause the one or more processors to perform a method as disclosed herein.

Figure 14:
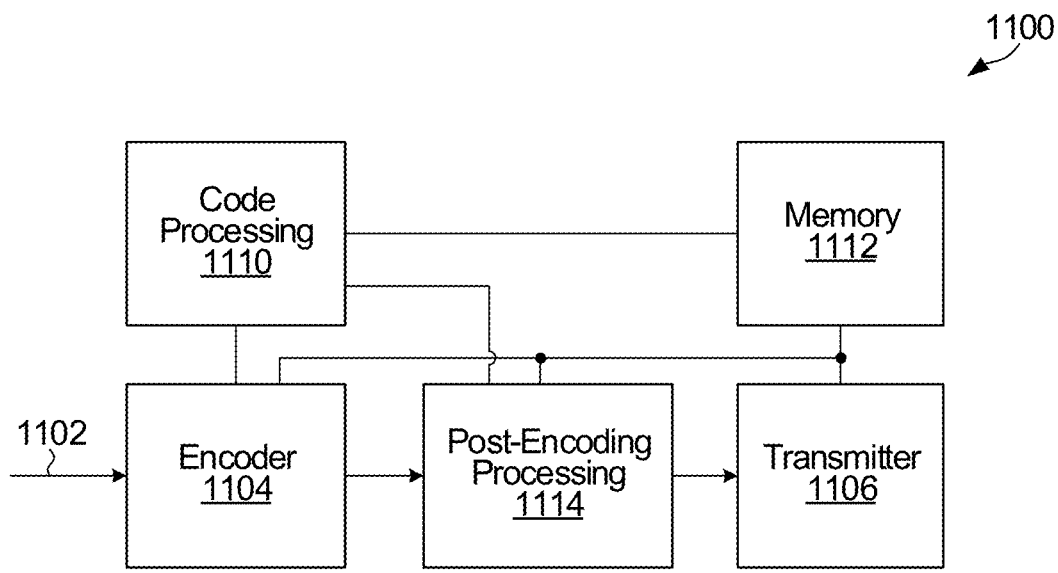
FIG. 14 is a block diagram of an apparatus for encoding and transmitting codewords.

FIG. 14 is a block diagram of an apparatus for encoding and transmitting codewords. The apparatus 1100 includes an encoder module 1104 coupled to a transmitter module 1106. The apparatus 1100 also includes a code processing module 1110 coupled to the encoder module 1104 and a post-encoding processing module 1114. The post-encoding processing module 1114 is also coupled to the encoder module 1104 and to the transmitter module 1106. A memory 1112, also shown in FIG. 14, is coupled to the encoder module 1104, to the code processing module 1110, to the post-encoding processing module 1114, and to the transmitter module 1106. Although not shown, the transmitter module 1106 could include a modulator, an amplifier, antenna and/or other modules or components of a transmit chain or alternatively could be configured to interface with a separate (Radio-Frequency—RF) transmission module. For example, some of all of the modules 1110, 1104, 1114, 1106, 1112 of the apparatus 1100 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the apparatus 1100 includes a non-transitory computer readable medium at 1112, that includes instructions for execution by a processor to implement and/or control operation of the code processing module 1110, the encoder module 1104, the post-encoding processing module 1114, the transmitter module 1106 in FIG. 14, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1112.

In some embodiments, the encoder module 1104 is implemented in circuitry, such as a processor, that is configured to encode input bits as disclosed herein. In a processor-based implementation of the encoder module 1104, processor-executable instructions to configure a processor to perform encoding operations are stored in a non-transitory processor-readable medium. The non-transitory medium could include, in the memory 1112 for example, one or more solid-state memory devices and/or memory devices with movable and possibly removable storage media. In that case, either the transformation or the permutation may be also implemented in the encoder module 1104.

The code processing module 1110 could be implemented in circuitry that is configured to determine coding parameters such as mother code block length, transformation patterns or permutation patterns, and to determine an ordered sub-channel sequence as disclosed herein. In some embodiments, the code processing module 1110 is implemented using a processor. The same processor or other circuitry, or separate processors or circuitry, could be used to implement both the encoder module 1104 and the code processing module 1110. As noted above for the encoder module 1104, in a processor-based implementation of the code processing module 1110, processor-executable instructions to configure a processor to perform code processing operations are stored in a non-transitory processor-readable medium, in the memory 1112 for example.

Like the encoder module 1104 and the code processing module 1110, the post-encoding processing module 1114 is implemented in circuitry, such as a processor, that is configured to perform various post-encoding operations. These post-encoding operations could include rate-matching operations such as puncturing, shortening and/or interleaving, for example. The permutation may be implemented in the post-encoding processing module 1114. However, it should be noted that to simplify the description, the scheme to implement transformation map is not provided. If the transformation is taken instead of permutation, the input to the apparatus 1100 will be the transformed data and in that case no permutation will be implemented in post-encoding processing module 1114. In a processor-based implementation of the post-encoding processing module 1114, processor-executable instructions to configure a processor to perform post-encoding operations are stored in a non-transitory processor-readable medium, examples of which are described above. In an embodiment, the post-encoding processing module 1114 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1110, stored to the memory 1112, or otherwise made available to the code processing module 1110 by the post-encoding processing module 1114.

The apparatus 1100 could implement any of various other features that are disclosed herein. For example, the encoder module 1104, the transmitter module 1106, the code processing module 1110, and/or the post-encoding processing module 1114 could be configured to implement any one or more of the features listed or otherwise described above in all embodiments.

In some alternative embodiments, the functionality of the encoder module 1104, the transmitter module 1106, the code processing module 1110, and/or the post-encoding processing module 1114 described herein may be fully or partially implemented in hardware or alternatively in software, for example in modules stored in a memory such as 1112 and executed by a processor(s) of the apparatus 1100.

An apparatus could therefore include a processor, and a memory such as 1112, coupled to the processor, storing instructions which, when executed by the processor, cause the processor to perform the functionality and/or embodiments described above in relation to the encoder module 1104, the transmitter module 1106, the code processing module 1110, and/or the post-encoding module 1114 described above.

Figure 15:
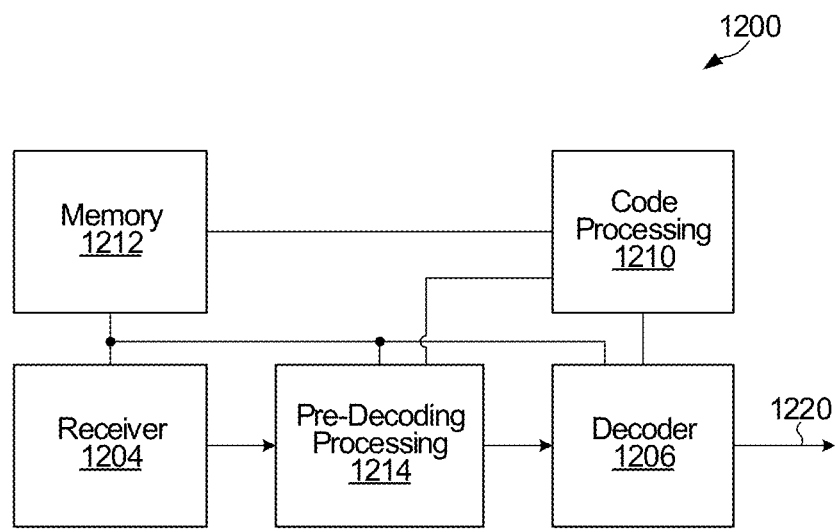
FIG. 15 is a block diagram of an example apparatus for receiving and decoding codewords.

FIG. 15 is a block diagram of an example apparatus for receiving and decoding codewords. The apparatus 1200 includes a receiver module 1204 which is configured to receive signals transmitted wirelessly and which is coupled to a decoder module 1206. The apparatus 1200 also includes a code processing module 1210 coupled to the decoder module 1206 and a pre-decoding processing module 1214. The pre-decoding processing module 1214 is also coupled to the decoder module 1206 and to the receiver module 1204. A memory 1212 also shown in FIG. 15, is coupled to the decoder module 1206, to the code processing module 1210, to the receiver module 1204, and to the pre-decoding processing module 1214.

Although not shown, the receiver module 1204 could include an antenna, demodulator, amplifier, and/or other modules or components of a receive chain or alternatively could be configured to interface with a separate (Radio-Frequency—RF) receiving module. For example, some of all of the modules 1210, 1204, 1214, 1206, 1212 of the apparatus 1200 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 1220 for further receiver processing.

In some embodiments, the apparatus 1200 includes a non-transitory computer readable medium at 1112, that includes instructions for execution by a processor to implement and/or control operation of the receiver module 1204, decoder module 1206, the code processing module 1210, and the pre-decoding processing module 1214 in FIG. 15, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1212.

The decoder module 1206 is implemented in circuitry, such as a processor, that is configured to decode received codewords as disclosed herein. In a processor-based implementation of the decoder module 1206, processor-executable instructions to configure a processor to perform decoding operations are stored in a non-transitory processor-readable medium. The non-transitory medium could include, in the memory 1212 for example, one or more solid-state memory devices and/or memory devices with movable and possibly removable storage media.

The code processing module 1210 is implemented in circuitry that is configured to determine (and store to the memory 1212) ordered sub-channel sequences as disclosed herein. In a processor-based implementation of the code-processing module 1210, processor-executable instructions to configure a processor to perform code-processing operations are stored in a non-transitory processor-readable medium, examples of which are described above. Information representing ordered sub-channel sequences, and/or the selected sub-channels could be provided to the decoder module 1206 by the code processing module 1210 for use in decoding received words, and/or stored in the memory 1212 by the code processing module 1210 for subsequent use by the decoder module 1206.

Like the decoder module 1206 and the code processing module 1210, the pre-decoding processing module 1214 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. De-permutation or de-transformation may also be implemented in the pre-decoding processing module 1214. In a processor-based implementation of the pre-decoding processing module 1214, processor-executable instructions to configure a processor to perform pre-decoding processing operations are stored in a non-transitory processor-readable medium, examples of which are described above. In an embodiment, the pre-decoding processing module 1214 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1210, stored to the memory 1212, or otherwise made available to the code processing module 1210 by the pre-decoding processing module 1214.

In some alternative embodiments, the functionality of the receiver module 1204, the decoder module 1206, the code processing module 1210, and/or the pre-decoding processing module 1214 described herein may be fully or partially implemented in software or modules, for example in receiving and decoding modules stored in a memory 1212 and executed by a processor(s) of the apparatus 1200.

An apparatus could therefore include a processor, and a memory such as 1212, coupled to the processor, storing instructions which, when executed by the processor, cause the processor to perform the functionality and/or embodiments disclosed herein, or receiving/decoding operations corresponding to transmitting/encoding operations disclosed herein. In the embodiment shown in FIG. 15, the apparatus 1200 includes the memory 1212, and the code processing module 1210, which is coupled to the memory 1212, could be configured to perform the computing, the determining, and the generating in accordance with embodiments disclosed herein.

The apparatus 1200 could implement any of various other features that are disclosed herein. For example, the decoder module 1206, the receiver module 1204, the code processing module 1210, and/or the pre-decoding processing module 1214 could be configured to implement any one or more of receiving/decoding features corresponding to encoding/transmitting features noted above.

Figure 16:
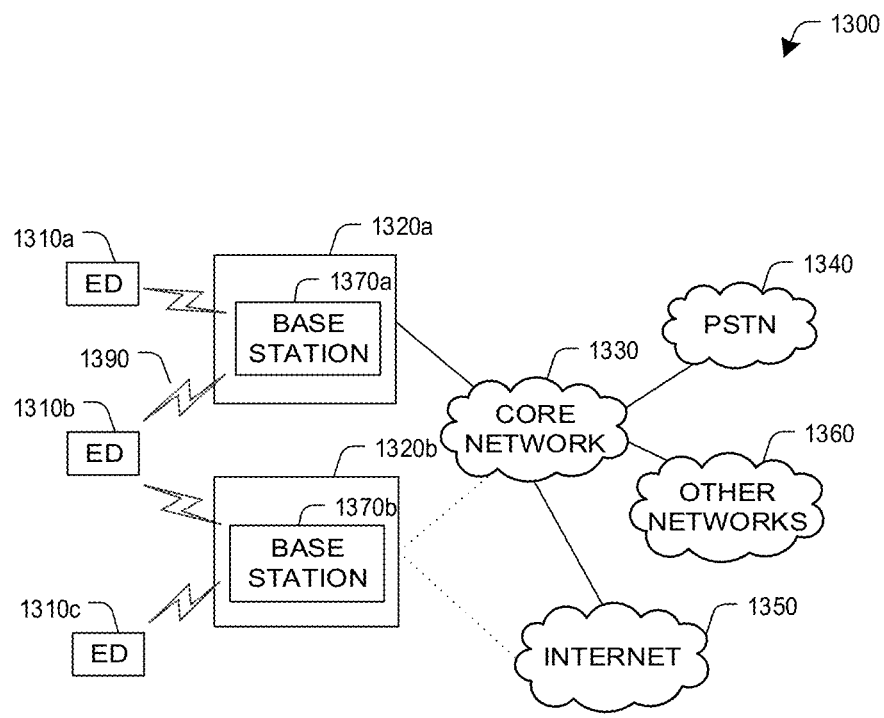
FIG. 16 is a block diagram of an example communication system in which embodiments disclosed herein may be used.

FIG. 16 illustrates an example communication system 1300 in which embodiments of the present disclosure could be implemented. In general, the system 100 enables multiple wireless or wired elements to communicate data and other content. The purpose of the system 1300 may be to provide content (voice, data, video, text) via broadcast, narrowcast, user device to user device, etc. The system 1300 may operate efficiently by sharing resources such as bandwidth.

In this example, the communication system 1300 includes electronic devices (ED) 1310a-1310c, radio access networks (RANs) 1320a-1320b, a core network 1330, a public switched telephone network (PSTN) 1340, the Internet 1350, and other networks 1360. While certain numbers of these components or elements are shown in FIG. 16, any reasonable number of these components or elements may be included in the system 1300.

The EDs 1310a-1310c and base stations 1370a-1370b are examples of communication equipment that can be configured to implement some or all of the functionality and/or embodiments described herein. For example, any one of the EDs 1310a-1310c and base stations 1370a-1370b could be configured to implement the encoding or decoding functionality (or both) described above. In another example, any one of the EDs 1310a-1310c and base stations 1370a-1370b could include the apparatus 1100, the apparatus 1200 or both described above in relation to FIGS. 14 and 15.

The EDs 1310a-1310c are configured to operate, communicate, or both, in the system 1300. For example, the EDs 1310a-1310c are configured to transmit, receive, or both via wireless or wired communication channels. Each ED 1310a-1310c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication device (MTC), personal digital assistant (PDA), smartphone, laptop, computer, touchpad, wireless sensor, or consumer electronics device.

In the embodiments given in this application, both ED and Base Station can act as transmit device. And correspondingly, both Base Station and ED can act as receive device.

In FIG. 16, the RANs 1320a-1320b include base stations 1370a-1370b, respectively. Each base station 1370a-1370b is configured to wirelessly interface with one or more of the EDs 1310a-1310c to enable access to any other base station 1370a-1370b, the core network 1330, the PSTN 1340, the Internet 1350, and/or the other networks 1360. For example, the base stations 1370a-1370b may include (or be) one or more of several well-known devices, such as a base transceiver station (BTS), a Node-B (NodeB), an evolved NodeB (eNodeB), a Home eNodeB, a gNodeB (sometimes called a "gigabit" NodeB), a transmission point (TP), a site controller, an access point (AP), or a wireless router. Any ED 1310a-1310c may be alternatively or jointly configured to interface, access, or communicate with any other base station 1370a-1370b, the internet 1350, the core network 1330, the PSTN 1340, the other networks 1360, or any combination of the preceding. Optionally, the system may include RANs, such as RAN 1320b, wherein the corresponding base station 1370b accesses the core network 1330 via the internet 1350, as shown.

In the embodiment shown in FIG. 16, the base station 1370a forms part of the RAN 1320a, which may include other base stations, base station controller(s) (BSC), radio network controller(s) (RNC), relay nodes, elements, and/or devices. Any base station 1370a, 1370b may be a single element, as shown, or multiple elements, distributed in the corresponding RAN, or otherwise. Also, the base station 1370b forms part of the RAN 1320b, which may include other base stations, elements, and/or devices. Each base station 1370a-1370b may be configured to operate to transmit and/or receive wireless signals within a particular geographic region or area, sometimes referred to as a "cell." A cell may be further divided into cell sectors, and a base station 1370a-1370b may, for example, employ multiple transceivers to provide service to multiple sectors. In some embodiments a base station 1370a-1370b may establish pico or femto cells where the radio access technology supports such. In some embodiments, multiple-input multiple-output (MIMO) technology may be employed having multiple transceivers for each cell. The number of RAN 1320a-1320b shown is exemplary only. Any number of RAN may be contemplated when devising the system 1300.

The base stations 1370a-1370b communicate with one or more of the EDs 1310a-1310c over one or more air interfaces 1390 using wireless communication links e.g. RF, μWave, IR, etc. The air interfaces 1390 may utilize any suitable radio access technology. For example, the system 1300 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1390.

A base station 1370a-1370b may implement Universal Mobile Telecommunication System (UMTS) Terrestrial Radio Access (UTRA) to establish an air interface 1390 using wideband CDMA (WCDMA). In doing so, the base station 1370a-1370b may implement protocols such as HSPA, HSPA+optionally including HSDPA, HSUPA or both. Alternatively, a base station 1370a-1370b may establish an air interface 1390 with Evolved UTMS Terrestrial Radio Access (E-UTRA) using LTE, LTE-A, and/or LTE-B. It is contemplated that the system 1300 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 1320a-1320b are in communication with the core network 1330 to provide the EDs 1310a-1310c with various services such as voice, data, and other services. Understandably, the RANs 1320a-1320b and/or the core network 1330 may be in direct or indirect communication with one or more other RANs (not shown), which may or may not be directly served by core network 1330, and may or may not employ the same radio access technology as RAN 1320a, RAN 1320b or both. The core network 1330 may also serve as a gateway access between (i) the RANs 1320a-1320b or EDs 1310a-1310c or both, and (ii) other networks (such as the PSTN 1340, the Internet 1350, and the other networks 1360). In addition, some or all of the EDs 1310a-1310c may include functionality for communicating with different wireless networks over different wireless links using different wireless technologies and/or protocols. Instead of wireless communication (or in addition thereto), the EDs 1310a-1310c may communicate via wired communication channels to a service provider or switch (not shown), and to the internet 1350. PSTN 1340 may include circuit switched telephone networks for providing plain old telephone service (POTS). Internet 1350 may include a network of computers and subnets (intranets) or both, and incorporate protocols, such as IP, TCP, UDP. EDs 1310a-1310c may be multimode devices capable of operation according to multiple radio access technologies, and incorporate multiple transceivers necessary to support such.

Figure 17A:
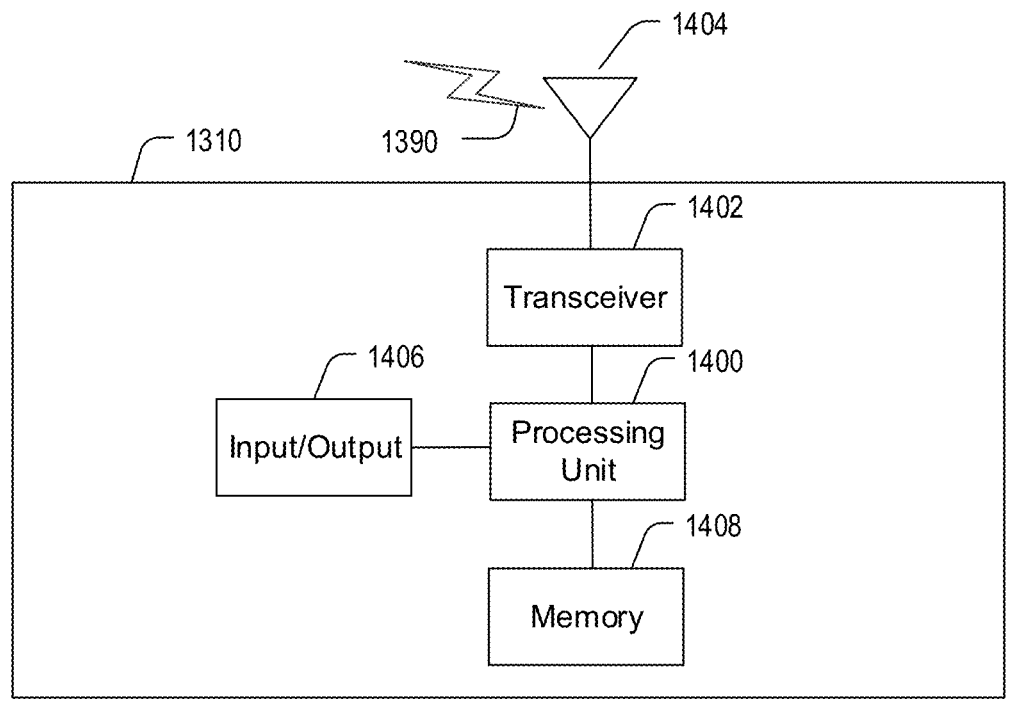
FIG. 17A and FIG. 17B are block diagrams of an example ED (Electronic Device) and an example base station which may implement embodiments disclosed herein.
Figure 17B:
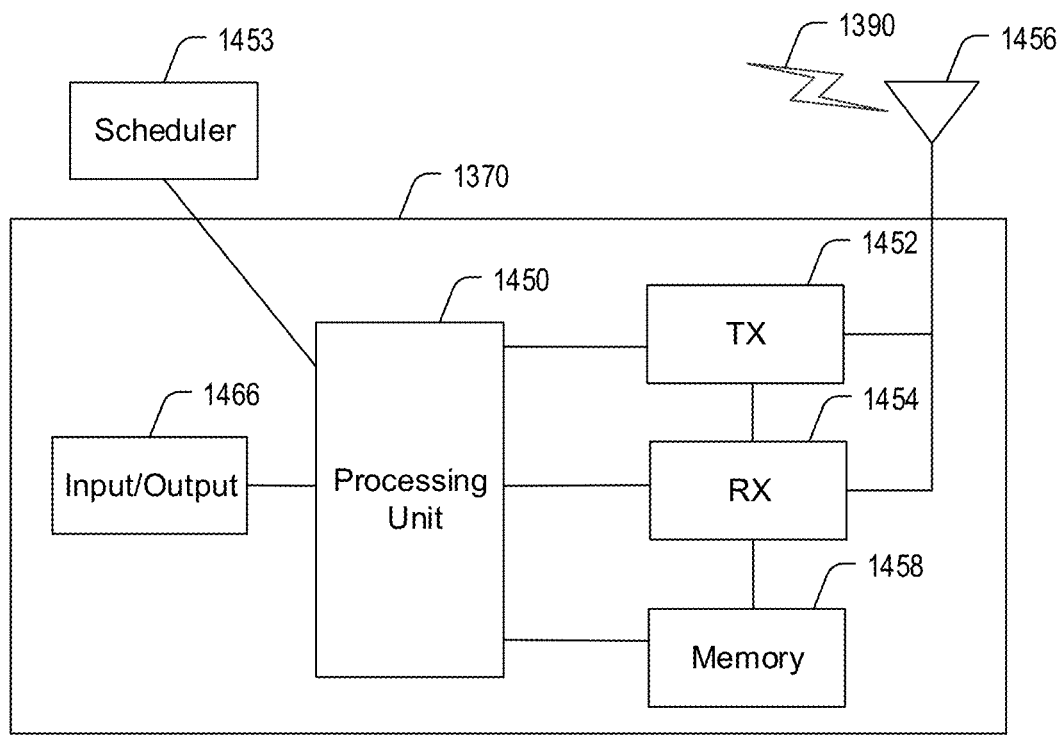

FIGS. 17A and 17B illustrate example devices that may implement the functionality and/or embodiments described above. In particular, FIG. 17A illustrates an example ED 1310, and FIG. 17B illustrates an example base station 1370. These components could be used in the system 1300 or in any other suitable system.

As shown in FIG. 17A, the ED 1310 includes at least one processing unit 1400. The processing unit 1400 implements various processing operations of the ED 1310. For example, the processing unit 1400 could perform signal coding, data processing, power control, input/output processing, or any other functionality enabling the ED 1310 to operate in the system 1300. The processing unit 1400 may also be configured to implement some or all of the functionality and/or embodiments described above. Each processing unit 1400 includes any suitable processing or computing device configured to perform one or more operations. Each processing unit 1400 could, for example, include a microprocessor, microcontroller, digital signal processor, field programmable gate array, or application specific integrated circuit.

The ED 1310 also includes at least one transceiver 1402. The transceiver 1402 is configured to modulate data or other content for transmission by at least one antenna or NIC (Network Interface Controller) 1404. The transceiver 1402 is also configured to demodulate data or other content received by the at least one antenna 1404. Each transceiver 1402 includes any suitable structure for generating signals for wireless or wired transmission and/or processing signals received wirelessly or by wire. Each antenna 1404 includes any suitable structure for transmitting and/or receiving wireless or wired signals. One or multiple transceivers 1402 could be used in the ED 1310, and one or multiple antennas 1404 could be used in the ED 1310. Although shown as a single functional unit, a transceiver 1402 could also be implemented using at least one transmitter and at least one separate receiver.

The ED 1310 further includes one or more input/output devices 1406 or interfaces (such as a wired interface to the interne 1350). The input/output devices 1406 facilitate interaction with a user or other devices (network communications) in the network. Each input/output device 1406 includes any suitable structure for providing information to or receiving/providing information from a user, such as a speaker, microphone, keypad, keyboard, display, or touch screen, including network interface communications.

In addition, the ED 1310 includes at least one memory 1408. The memory 1408 stores instructions and data used, generated, or collected by the ED 1310. For example, the memory 1408 could store software instructions or modules configured to implement some or all of the functionality and/or embodiments described above and that are executed by the processing unit(s) 1400. Each memory 1408 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 17B, the base station 1370 includes at least one processing unit 1450, at least one transmitter 1452, at least one receiver 1454, one or more antennas 1456, at least one memory 1458, and one or more input/output devices or interfaces 1466. A transceiver, not shown, may be used instead of the transmitter 1452 and receiver 1454. A scheduler 1453 may be coupled to the processing unit 1450. The scheduler 1453 may be included within or operated separately from the base station 1370. The processing unit 1450 implements various processing operations of the base station 1370, such as signal coding, data processing, power control, input/output processing, or any other functionality. The processing unit 1450 can also be configured to implement some or all of the functionality and/or embodiments described in more detail above. Each processing unit 1450 includes any suitable processing or computing device configured to perform one or more operations. Each processing unit 1450 could, for example, include a microprocessor, microcontroller, digital signal processor, field programmable gate array, or application specific integrated circuit.

Each transmitter 1452 includes any suitable structure for generating signals for wireless or wired transmission to one or more EDs or other devices. Each receiver 1454 includes any suitable structure for processing signals received wirelessly or by wire from one or more EDs or other devices. Although shown as separate components, at least one transmitter 1452 and at least one receiver 1454 could be combined into a transceiver. Each antenna 1456 includes any suitable structure for transmitting and/or receiving wireless or wired signals. While a common antenna 1456 is shown here as being coupled to both the transmitter 1452 and the receiver 1454, one or more antennas 1456 could be coupled to the transmitter(s) 1452, and one or more separate antennas 1456 could be coupled to the receiver(s) 1454. Each memory 1458 includes any suitable volatile and/or non-volatile storage and retrieval device(s) such as those described above in connection to the ED 1310. The memory 1458 stores instructions and data used, generated, or collected by the base station 1370. For example, the memory 1458 could store software instructions or modules configured to implement some or all of the functionality and/or embodiments described above and that are executed by the processing unit(s) 1450.

Each input/output device 1466 facilitates interaction with a user or other devices (network communications) in the network. Each input/output device 1466 includes any suitable structure for providing information to or receiving/providing information from a user, including network interface communications.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as the new 5G NR. The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

The invention claimed is:

1. A polar encoding method in a transmitting device, comprising,
    obtaining an information bit sequence, wherein the information bit sequence corresponds to a basic ordered sequence with a symmetric property;
    making a number of different transformation mappings on the information bit sequence to obtain a transformed sequence, wherein the number of different transformation mappings is dr, and each of the dr mappings is one of d number of transformation patterns, wherein dr and d are integers, d is a maximum number of different transformation patterns for the basic ordered sequence, dr<=d, and a length of the basic ordered sequence N is equal to $2^m$; and
    encoding the transformed sequence based on the basic ordered sequence.

2. The polar encoding method in claim 1, where, the transformation mapping φ satisfies:

$$\forall\, j \in \{0, 1, \ldots, m-1\}\ \varphi(x_j) = x_j + \sum_{s=n_j+1}^{2^m-1} r_s^{(j)} \cdot m_{i_s}$$

wherein $x_j$ is a variable, j and m are integers, $m_i$ is a m-variate monomial corresponds to $g_i$, $g_i$ is the ith row of mth Kronecker power of matrix $$\begin{bmatrix} 1 & 0 \\ 1 & 1 \end{bmatrix}.$$

$r_s^{(j)} \in \{0,1\}$, s is from $\{n_j+1, n_j+2, \ldots, 2^m-1\}$, $n_j$ is specified such that $i_{n_j}=2^m-1-2^j$, and $i_{n_j}$ is the $n_j$-th value of the basic ordered sequence.

3. The polar encoding method in claim 2, wherein if the values of all $r_s^{(j)}$ are fixed for the basic ordered sequence, and there are up to d different transformation mapping.

4. The polar encoding method in claim 1, wherein the information bit sequence includes cyclic redundancy check bits.

5. The polar encoding method in any of claim 1, wherein
d=16 if the length of the basic ordered sequence is 256 or 512 or 1024; or
d=8 if the length of the basic ordered sequence is 16 or 32 or 64 or 128.

6. The polar encoding method in claim 1, wherein the information bit sequence includes the information of a primary broadcast channel.

7. A polar encoding method in a transmitting device, comprising,
obtaining an information bit sequence, wherein the information bit sequence corresponds to a basic ordered sequence N with a symmetric property;
encoding the information bit sequence based on the basic ordered sequence, wherein a length of the basic ordered sequence N is equal to $2^m$; and
making dr number of different permutations, wherein each of the dr number of permutations is one of d number of permutation patterns, where dr and d are integers, d is the maximum number of different permutation patterns for the basic ordered sequence, dr<=d.

8. The polar encoding method in claim 7, where one of the d permutation patterns is calculated from a transformation mapping $\varphi$.

9. The polar encoding method in claim 8, where the $i_{th}$ element of the permutation pattern is
$\forall i \in \{0, 1, \ldots, N-1\}$ $\pi(i)=j_i$, wherein the number $j_i$ satisfies that i-th column of M, M is the submatrix of $G_2^{\otimes m}$ that include all rows with row weight of N/2, $G_2^{\otimes m}$ is the mth Kronecker power of matrix $$\begin{bmatrix} 1 & 0 \\ 1 & 1 \end{bmatrix},$$

$M_\varphi$ is constructed based on the transformation map $\varphi$.

10. The polar encoding method in claim 8, where the transformation mapping $\varphi$ satisfies:

$$\forall j \in \{0, 1, \ldots, m-1\} \varphi(x_j) = x_j + \sum_{s=n_j+1}^{2^m-1} r_s^{(j)} \cdot m_{i_s}$$

wherein $x_j$ is a variable, j and m are integers, $m_i$ is a m-variate monomial corresponds to $g_i$, $g_i$ is the i-th row of m-th Kronecker power of matrix $$\begin{bmatrix} 1 & 0 \\ 1 & 1 \end{bmatrix},$$

$r_s^{(j)} \in \{0,1\}$, s is from $\{n_j+1, n_j+2, \ldots, 2^m-1\}$, $n_j$ is specified such that $i_{n_j}=2^m-1-2^j$, and $i_{n_j}$ is the $n_j$-th value of the basic ordered sequence.

11. The polar encoding method in claim 7, wherein if the values of all s are fixed for the basic ordered sequence, there are up to d different permutation patterns.

12. The polar encoding method in claim 7, wherein the information bit sequence includes cyclic redundancy check bits.

13. The polar encoding method in claim 7, wherein
d=16 if the length of the basic ordered sequence is 256 or 512 or 1024; or
d=8 if the length of the basic ordered sequence is 16 or 32 or 64 or 128.

14. The polar encoding method in claim 7, wherein the information bit sequence includes the information of a primary broadcast channel.

15. A polar decoding method in a receiving device, comprising
obtaining a to-be-decoded sequence, wherein the to-be-decoded sequence corresponds to a basic ordered sequence with a symmetric property;
making a number of different de-permutations over the to-be-decoded sequence, wherein the number of different de-permutations is dr and each of the dr de-permutation patterns corresponds to a permutation pattern in a transmitting device, wherein the permutation is one of d permutation patterns, dr and d are integers, d is a maximum number of different permutation patterns for the basic ordered sequence;
decoding the de-permutated to-be-decoded sequence based on a basic ordered sequence, the length of the basic ordered sequence N is equal to $2^m$.

16. The polar decoding method in claim 15, where the permutation pattern is calculated from a transformation mapping $\varphi$.

17. The polar decoding method in claim 15, where the ith element of the permutation pattern is
$\forall i \in \{0, 1, \ldots, N-1\}$ $\pi(i)=j_i$, wherein the number $j_i$ satisfies that i-th column of M, M is the submatrix of $G_2^{\otimes m}$ that include all rows with row weight of N/2, $G_2^{\otimes m}$ is the m-th Kronecker power of matrix $$\begin{bmatrix} 1 & 0 \\ 1 & 1 \end{bmatrix},$$

$M_\varphi$ is constructed based on the transformation map $\varphi$.

18. The polar decoding method in claim 16, where the transformation mapping $\varphi$ satisfies:

$$\forall j \in \{0, 1, \ldots, m-1\} \ \varphi(x_j) = x_j + \sum_{s=n_j+1}^{2^m-1} r_s^{(j)} \cdot m_{i_s}$$

where $x_j$ is a variable, j and m are integers, $m_i$ is a m-variate monomial corresponds to $g_i$, $g_i$ is the ith row of mth Kronecker power of matrix $$\begin{bmatrix} 1 & 0 \\ 1 & 1 \end{bmatrix},$$

$r_s^{(j)} \in \{0,1\}$, s is from $\{n_j+1, n_j+2, \ldots, 2^m-1\}$ $n_j$ is specified such that $i_{n_j}=2^m-1-2^j$, and $i_{n_j}$ is the $n_j$-th value of the basic ordered sequence.

19. The polar encoding method in claim 15, wherein if the values of all $r_s^{(j)}$ are fixed for the basic ordered sequence, there are up to d different permutation patterns.

20. The polar encoding method in claim 15, wherein the information bit sequence includes cyclic redundancy check bits.

* * * * *